United States Patent
Yoshizumi et al.

(10) Patent No.: US 8,741,674 B2
(45) Date of Patent: Jun. 3, 2014

(54) GROUP-III NITRIDE SEMICONDUCTOR LASER DEVICE, AND METHOD FOR FABRICATING GROUP-III NITRIDE SEMICONDUCTOR LASER DEVICE

(75) Inventors: Yusuke Yoshizumi, Itami (JP); Shimpei Takagi, Osaka (JP); Yohei Enya, Itami (JP); Takashi Kyono, Itami (JP); Masahiro Adachi, Osaka (JP); Masaki Ueno, Itami (JP); Takamichi Sumitomo, Itami (JP); Shinji Tokuyama, Osaka (JP); Koji Katayama, Osaka (JP); Takao Nakamura, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 233 days.

(21) Appl. No.: 13/335,560

(22) Filed: Dec. 22, 2011

(65) Prior Publication Data
US 2012/0142130 A1   Jun. 7, 2012
US 2013/0295704 A9   Nov. 7, 2013

Related U.S. Application Data

(60) Division of application No. 12/836,170, filed on Jul. 14, 2010, which is a continuation of application No. PCT/JP2009/062895, filed on Jul. 16, 2009.

(30) Foreign Application Priority Data

Jun. 17, 2009   (JP) .................. 2009-144442
Jan. 18, 2010   (JP) .................. 2010-008181

(51) Int. Cl.
  *H01L 21/00*   (2006.01)
  *H01L 21/8252*   (2006.01)

(52) U.S. Cl.
  USPC ............................. 438/33; 438/46

(58) Field of Classification Search
  USPC ....................................... 438/33, 46
  See application file for complete search history.

(56) References Cited

U.S. PATENT DOCUMENTS 6,356,572 B1   3/2002   Tanaka et al.
6,680,959 B2   1/2004   Tanabe et al.

(Continued)

FOREIGN PATENT DOCUMENTS

JP   2001-230497 A   8/2001
JP   2005-353690 A   12/2005

(Continued)

OTHER PUBLICATIONS

English-language International Preliminary Report on Patentability (Aug. 16, 2012) and Written Opinion issued in related International Patent Application No. PCT/JP2010/073723 (Jan. 25, 2011).*

(Continued)

*Primary Examiner* — Mary Wilczewski
(74) *Attorney, Agent, or Firm* — Venable LLP; Michael A. Sartori; Tamatane J. Aga

(57) ABSTRACT

Provided is a group-III nitride semiconductor laser device with a laser cavity of high lasing yield, on a semipolar surface of a support base in which the c-axis of a hexagonal group-III nitride is tilted toward the m-axis. First and second fractured faces to form the laser cavity intersect with an m-n plane. The group-III nitride semiconductor laser device has a laser waveguide extending in a direction of an intersecting line between the m-n plane and the semipolar surface. In a laser structure, a first surface is opposite to a second surface. The first and second fractured faces extend from an edge of the first surface to an edge of the second surface. The fractured faces are not formed by dry etching and are different from conventionally-employed cleaved facets such as c-planes, m-planes, or a-planes.

10 Claims, 22 Drawing Sheets

(56) References Cited

U.S. PATENT DOCUMENTS

| | | | |
|---|---|---|---|
| 6,797,991 B2 | 9/2004 | Ishida | |
| 7,501,667 B2 | 3/2009 | Hasegawa et al. | |
| 7,851,821 B2 | 12/2010 | Kyono et al. | |
| 7,933,303 B2* | 4/2011 | Yoshizumi et al. | 372/44.011 |
| 8,071,405 B2* | 12/2011 | Takagi et al. | 438/33 |
| 8,076,167 B2* | 12/2011 | Takagi et al. | 438/33 |
| 8,105,857 B2* | 1/2012 | Takagi et al. | 438/33 |
| 8,139,619 B2* | 3/2012 | Takagi et al. | 372/44.011 |
| 8,175,129 B2* | 5/2012 | Yoshizumi et al. | 372/45.01 |
| 8,213,475 B2* | 7/2012 | Takagi et al. | 372/45.01 |
| 8,227,277 B2* | 7/2012 | Yoshizumi et al. | 438/33 |
| 8,265,113 B2* | 9/2012 | Yoshizumi et al. | 372/44.01 |
| 8,306,082 B2* | 11/2012 | Yoshizumi et al. | 372/44.011 |
| 8,361,885 B2* | 1/2013 | Yoshizumi et al. | 438/462 |
| 8,389,312 B2* | 3/2013 | Yoshizumi et al. | 438/33 |
| 8,401,048 B2* | 3/2013 | Takagi et al. | 372/44.011 |
| 2002/0027933 A1 | 3/2002 | Tanabe et al. | |
| 2003/0185268 A1 | 10/2003 | Zhang | |
| 2005/0042787 A1 | 2/2005 | Ito et al. | |
| 2005/0185687 A1 | 8/2005 | Ohgoh | |
| 2005/0208687 A1 | 9/2005 | Kasai et al. | |
| 2005/0269584 A1 | 12/2005 | Hasegawa et al. | |
| 2007/0201527 A1 | 8/2007 | Hori et al. | |
| 2008/0191223 A1 | 8/2008 | Nakamura et al. | |
| 2008/0230766 A1 | 9/2008 | Okamoto et al. | |
| 2008/0285609 A1 | 11/2008 | Ohta et al. | |
| 2008/0308906 A1 | 12/2008 | Osada et al. | |
| 2009/0059983 A1 | 3/2009 | Hasegawa et al. | |
| 2009/0086778 A1 | 4/2009 | Kameyama et al. | |
| 2010/0230690 A1 | 9/2010 | Kyono et al. | |
| 2011/0013657 A1 | 1/2011 | Sumitomo et al. | |
| 2011/0058585 A1 | 3/2011 | Yoshizumi et al. | |
| 2011/0064100 A1 | 3/2011 | Raring et al. | |
| 2011/0073888 A1 | 3/2011 | Ueno et al. | |
| 2011/0075694 A1* | 3/2011 | Yoshizumi et al. | 372/45.01 |
| 2011/0075695 A1* | 3/2011 | Yoshizumi et al. | 372/45.011 |
| 2011/0128983 A1 | 6/2011 | Takagi et al. | |
| 2011/0158275 A1 | 6/2011 | Yoshizumi et al. | |
| 2011/0158276 A1 | 6/2011 | Takagi et al. | |
| 2011/0158277 A1* | 6/2011 | Yoshizumi et al. | 372/44.011 |
| 2011/0164637 A1* | 7/2011 | Yoshizumi et al. | 372/44.011 |
| 2011/0164638 A1 | 7/2011 | Yoshizumi et al. | |
| 2011/0176569 A1 | 7/2011 | Takagi et al. | |
| 2011/0216795 A1 | 9/2011 | Hsu et al. | |
| 2011/0228804 A1* | 9/2011 | Yoshizumi et al. | 372/44.011 |
| 2011/0292956 A1 | 12/2011 | Takagi et al. | |
| 2011/0299560 A1* | 12/2011 | Takagi et al. | 372/44.011 |
| 2012/0008660 A1 | 1/2012 | Fuji et al. | |
| 2012/0027039 A1 | 2/2012 | Takagi et al. | |
| 2012/0058583 A1* | 3/2012 | Yoshizumi et al. | 438/33 |
| 2012/0100654 A1* | 4/2012 | Takagi et al. | 438/46 |
| 2012/0142130 A1* | 6/2012 | Yoshizumi et al. | 438/33 |
| 2012/0184057 A1* | 7/2012 | Yoshizumi et al. | 438/29 |
| 2012/0202304 A1* | 8/2012 | Yoshizumi et al. | 438/33 |
| 2012/0214268 A1* | 8/2012 | Takagi et al. | 438/33 |
| 2012/0258557 A1* | 10/2012 | Yoshizumi et al. | 438/33 |
| 2012/0269220 A1* | 10/2012 | Kyono et al. | 372/45.01 |
| 2013/0051417 A1* | 2/2013 | Sumitomo et al. | 372/44.011 |

FOREIGN PATENT DOCUMENTS

| | | |
|---|---|---|
| JP | 2007-184353 A | 7/2007 |
| JP | 2008-235804 A | 10/2008 |
| JP | 2009-081336 A | 4/2009 |
| JP | 2009-253154 A | 10/2009 |
| JP | 4375497 B1 | 12/2009 |
| WO | WO-2008/100504 A1 | 8/2008 |

OTHER PUBLICATIONS

Office Action in U.S. Appl. No. 12/836,170 dated Jan. 23, 2013.

Nakamura, S. et al. "InGaN-Based Multi-Quantum-Well-Structure Laser Diodes," Japanese Journal of Applied Physics, vol. 35, Part. 2., No. 1B, pp. L74-L76 (Jan. 15, 1996).

Yamaguchi, A. "Anisotropic Optical Matrix Elements in Strained GaN Quantum Wells on Semipolar and Nonpolar Substrates," Japanese Journal of Applied Physics, vol. 46, No. 33, pp. L789-L791 (2007).

Asamizu, H. et al. "Demonstration of 426nm InGaN/GaN Laser Diodes Fabricated on Free-Standing Semipolar (11-22) Gallium Nitride Substrates," Applied Physics Express 1, pp. 091102-1-091102-3 (2008).

Tyagi, A. et al., "Semipolar (10-1-1) InGaN/GaN Laser Diodes on Bulk GaN Substrates," Japanese Journal of Applied Physics, vol. 46, No. 19, pp. L444-L445, (2007).

Okamoto et al. "Nonpolar m-plane InGaN Multiple Quantum Well Laser Diodes With a Lasing Wavelength of 499.8 nm," Applied Physics Letters 94, p. 071105-1-p. 071105-3, (2009).

Funato et al., "Blue, Green, and Amber InGaN/GaN Light-Emitting Diodes on Semipolar {1122} GaN Bulk Substrates," Japanese Journal of Applied Physics, 45, pp. L695-L662 (Jun. 30, 2006).

Office Action in U.S. Appl. No. 13/240,368 dated Aug. 23, 2012.

International Preliminary Report on Patentability and Written Opinion in International Application No. PCT/JP2009/062895 dated Jan. 26, 2012.

Office Action in U.S. Appl. No. 13/050,330 dated Nov. 6, 2012.

Office Action in Japanese Patent Application No. 2009-144442 dated Jan. 5, 2010.

Notice of Allowance in U.S. Appl. No. 12/844,446 dated Dec. 17, 2010.

Office Action in U.S. Appl. No. 13/050,330 dated Jun. 24, 2011.

International Search Report in International Application No. PCT/JP2009/062895 dated Aug. 18, 2009.

* cited by examiner (a)

(b)

$$\rho = \frac{I_1 - I_2}{I_1 + I_2}$$

| PLANE INDEX h k i l | ANGLE BETWEEN M-PLANE AND PLANE OF PLANE INDEX DESCRIBED IN LEFT COLUMN | ANGLE BETWEEN PRINCIPAL SURFACE AND C-PLANE |
|---|---|---|
| (-1 0 1 1) | 61.96 | 28.04 |
| (-1 0 1 2) | 43.19 | 46.81 |
| (-1 0 1 3) | 32.04 | 57.96 |
| (-1 0 1 4) | 25.14 | 64.86 |
| (-1 0 1 5) | 20.58 | 69.42 |
| (-1 0 1 6) | 17.38 | 72.62 |
| (-1 0 1 7) | 15.01 | 74.99 |
| (-1 0 1 8) | 13.21 | 76.79 |
| (-1 0 1 9) | 11.78 | 78.22 |
| (-1 0 1 10) | 10.63 | 79.37 |
| (-1 0 1 11) | 9.69 | 80.31 |

US 8,741,674 B2

GROUP-III NITRIDE SEMICONDUCTOR LASER DEVICE, AND METHOD FOR FABRICATING GROUP-III NITRIDE SEMICONDUCTOR LASER DEVICE

CROSS-REFERENCE TO RELATED APPLICATIONS

This application is a Divisional of U.S. patent application No. 12/836,170, filed Jul. 14, 2010, which claims the benefit of Japan Patent Application No. 2010-008181, filed Jan. 18, 2010. U.S. patent application Ser. No. 12/836,170 is also a continuation of International Application No. PCT/JP2009/062895 filed Jul. 16, 2009, which claims the benefit of priority to Japanese Patent Application No. 2009-144442 filed Jun. 17, 2009, priority of which is claimed herein.

BACKGROUND OF THE INVENTION

1. Field of the Invention

The present invention relates to a group-III nitride semiconductor laser device, and a method for fabricating the group-III nitride semiconductor laser device.

2. Related Background Art

Non-patent Document 1 (Jpn. J. Appl. Phys. Vol. 35, (1996) L74-L76) describes a semiconductor laser made on a c-plane sapphire substrate. The mirror faces of the semiconductor laser are formed by dry etching. The Document 1 shows micrographs of the laser cavity mirror faces of the laser, and describes that the roughness of the end faces is about 50 nm.

Non-patent Document 2 (Appl. Phys. Express 1 (2008) 091102) describes a semiconductor laser formed on a (11-22) plane GaN substrate. The mirror faces of the semiconductor laser are formed by dry etching.

Non-patent Document 3 (Jpn. J. Appl. Phys. Vol. 46, (2007) L789) describes a gallium nitride (GaN)-based semiconductor laser. It proposes generation of laser light polarized in an off direction of the c-axis of the substrate, in order to use m-plane cleaved facets for the laser cavity. Specifically, this Document describes increase of the well thickness on a non-polar surface and decrease of the well thickness on a semipolar surface.

SUMMARY OF THE INVENTION

The band structure of the GaN-based semiconductor has some possible transitions capable of lasing. According to the inventor's knowledge, it is considered that in the group-III nitride semiconductor laser device using the semipolar-plane support base the c-axis of which tilts toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the above possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the laser cavity mirrors. For this reason, the laser cavity mirrors have been made heretofore by forming dry-etched facets of semiconductor layers by reactive ion etching (RIE). What is now desired is an improvement (that is to say, the development of laser cavity of high lasing yield) in the laser cavity mirrors, which have been formed by RIE, in terms of perpendicularity to the laser waveguide, flatness of the dry-etched facets, or ion damage. It becomes a heavy burden to find process conditions for obtaining excellent dry-etched faces in the current technical level.

As far as the inventor knows, in a single group-III nitride semiconductor laser device formed on the semipolar surface, no one has succeeded heretofore in achieving both of the laser waveguide, which extends in the tilting direction (off direction) of the c-axis, and the end faces for laser cavity mirrors formed without use of dry etching.

The present invention has been accomplished in view of the above-described circumstances. It is an object of the present invention to provide a group-III nitride semiconductor laser device with a laser cavity of high lasing yield, on the semipolar surface of a support base that tilts with respect to the c-axis toward the m-axis of a hexagonal group-III nitride. It is another object of the present invention to provide a method for fabricating the group-III nitride semiconductor laser device.

A group-III nitride semiconductor laser device according to one aspect of the present invention comprises: a laser structure including a support base and a semiconductor region, the support base comprising a hexagonal group-III nitride semiconductor and having a semipolar principal surface, the semiconductor region being provided on the semipolar principal surface of the support base; and an electrode being provided on the semiconductor region of the laser structure, the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the support base tilting at a finite angle ALPHA with respect to the normal axis toward an m-axis of the hexagonal group-III nitride semiconductor, the angle ALPHA falling within a range of not less than 45° and not more than 80° or within a range of not less than 100° and not more than 135°, the laser structure including first and second fractured faces, the first and second fractured faces intersecting with an m-n plane defined by the m-axis of the hexagonal group-III nitride semiconductor and the normal axis, a laser cavity of the group-III nitride semiconductor laser device including the first and second fractured faces, the laser structure including first and second surfaces, the first surface is opposite to the second surface, each of the first and second fractured faces extending from an edge of the first surface to an edge of the second surface, an end face of the support base and an end face of the semiconductor region being exposed in each of the first and second fractured faces, and the first and second fractured faces including a region such that an angle between this region and a plane indicated by plane index (−1, 0, 1, L) or (1, 0, −1, −L) falls within a range of not less than −5° and not more than +5°, with L as an integer number not less than 4. Therefore, the first and second fractured faces forming the laser cavity mirrors include the region of the plane index such as mentioned above. Thus, these laser cavity mirrors has flatness and perpendicularity, and the lasing yield of the laser cavity can be improved.

In this group-III nitride semiconductor laser device, the first and second fractured faces can include a region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than −10° and not more than +10°. Therefore, even when the first and second fractured faces included in the laser cavity include the region such that the angle formed by this region and the arrangements of N atom-Ga atom of the hexagonal group-III nitride semiconductor of the support base falls within a range of not less than −10° and not more than +10°, the first and second fractured faces have flatness and perpendicularity as a laser cavity mirror, and thus, the lasing yield of the laser cavity can be improved.

In this group-III nitride semiconductor laser device, a part of the first and second fractured faces that is included in the active layer can include a part of or the whole of an region such that an angle between this region and the plane indicated by plane index (−1, 0, 1, L) or (1, 0, −1, −L) falls within a range of not less than −5° and not more than +5°. Therefore, the part that is at least included in the active layer on the first and second fractured faces forming the laser cavity mirrors includes the region of the plane index such as above. Thus, these laser cavity mirrors have flatness and perpendicularity, and the lasing yield of the laser cavity can be improved.

In this group-III nitride semiconductor laser device, a part of the first and second fractured faces that is included in the active layer can include a part of or the whole of an region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than −10° and not more than +10°. Even when the part that is at least included in the active layer on the first and second fractured faces forming the laser cavity mirrors includes the region such that the angle formed by this region and the arrangements of N atom-Ga atom of the hexagonal group-III nitride semiconductor of the support base falls within a range of not less than −10° and not more than +10°, the first and second fractured faces have flatness and perpendicularity as a laser cavity mirror, and thus, the lasing yield of the laser cavity can be improved.

In this group-III nitride semiconductor laser device, the angle ALPHA falls within a range of not less than 63° and not more than 80° or within a range of not less than 100° and not more than 117°. In this group-III nitride semiconductor laser device, when the angle ALPHA is in a range of not less than 63° and not more than 80° or in a range of not less than 100° and not more than 117°, it is going to be more likely that the end face formed by the press will be almost perpendicular to the principal surface of the substrate. Furthermore, when the angle is in a range of more than 80° and less than 100°, it might result in failing to achieve desired flatness and perpendicularity.

In this group-III nitride semiconductor laser device, a thickness of the support base is not more than 400 µm. This group-III nitride semiconductor laser device can be used to obtain a good-quality fractured face for a laser cavity.

In this group-III nitride semiconductor laser device, a thickness of the support base is not less than 50 µm and not more than 100 µm. When the thickness is not less than 50 µm, handling becomes easier, and production yield becomes higher. When the thickness is in a range of not more than 100 µm, it can be used to obtain a good-quality fractured face for a laser cavity.

In this group-III nitride semiconductor laser device, laser light from the active layer is polarized in a direction of an a-axis of the hexagonal group-III nitride semiconductor. In this group-III nitride semiconductor laser device, a band transition allowing for implementation of a low threshold current has polarized nature.

In this group-III nitride semiconductor laser device, light in an LED mode of the group-III nitride semiconductor laser device includes a polarization component I2 in a direction indicated by a projection of the c-axis of the hexagonal group-III nitride semiconductor onto the principal surface, and a polarization component I1 in the direction of an a-axis of the hexagonal group-III nitride semiconductor, and the polarization component I1 is greater than the polarization component I2. In this group-III nitride semiconductor laser device, using the laser cavity of the group-III nitride semiconductor laser device, the device can be lased to emit light in a mode with large emission intensity in the LED mode.

In this group-III nitride semiconductor laser device, the semipolar principal surface is slightly tilted in a range of not less than −4° and not more than +4° with respect to any one of {20-21} plane, {10-11} plane, {20-2-1} plane, and {10-1-1} plane. In this group-III nitride semiconductor laser device, when the slight tilt surface tilts from these typical semipolar surfaces, it is also feasible to provide the first and second end faces with flatness and perpendicularity enough to construct the laser cavity of the group-III nitride semiconductor laser device.

In this group-III nitride semiconductor laser device, the semipolar principal surface is any one of {20-21} plane, {10-11} plane, {20-2-1} plane, and {10-1-1} plane. In this group-III nitride semiconductor laser device, these typical semipolar surfaces can provide the first and second end faces with flatness and perpendicularity enough to construct the laser cavity of the group-III nitride semiconductor laser device.

In this group-III nitride semiconductor laser device, a stacking fault density of the support base is not more than $1 \times 10^4$ cm$^{-1}$. In this group-III nitride semiconductor laser device, since the stacking fault density is in a range of not more than $1 \times 10^4$ cm$^{-1}$, the flatness and/or perpendicularity of the fractured face is less likely to be disturbed for a certain accidental reason.

In this group-III nitride semiconductor laser device, the support base comprises any one of GaN, AlGaN, AlN, InGaN, and InAlGaN. In this group-III nitride semiconductor laser device, when the substrate used comprises one of these GaN-based semiconductors, it becomes feasible to obtain the first and second end faces applicable to the cavity. Use of an AlN substrate or AlGaN substrate allows for increase in polarization degree and for enhancement of optical confinement by virtue of low refractive index. Use of an InGaN substrate allows for decrease in the degree of lattice mismatch between the substrate and the light emitting layer and for improvement in crystal quality.

This group-III nitride semiconductor laser device further comprises a dielectric multilayer film provided on at least one of the first and second fractured faces. In this group-III nitride semiconductor laser device, an end face coat is also applicable to the fractured faces. The end face coat allows for adjustment of reflectance.

In this group-III nitride semiconductor laser device, the active layer includes a light emitting region provided so as to generate light at a wavelength of not less than 360 nm and not more than 600 nm. Since this group-III nitride semiconductor laser device makes use of the semipolar surface, the resultant device is the group-III nitride semiconductor laser device making efficient use of polarization in the LED mode, and achieves a low threshold current.

In this group-III nitride semiconductor laser device, the active layer includes a quantum well structure provided so as to generate light at a wavelength of not less than 430 nm and not more than 550 nm. Since this group-III nitride semiconductor laser device makes use of the semipolar surface, it allows for increase in quantum efficiency through decrease of the piezoelectric field and improvement in crystal quality of the light emitting layer region, and it is thus suitably applicable to generation of light at the wavelength of not less than 430 nm and not more than 550 nm.

A method for fabricating a group-III nitride semiconductor laser device according to one aspect of the present invention comprises the steps of: preparing a substrate of a hexagonal group-III nitride semiconductor, the substrate having a semipolar principal surface; forming a substrate product that has a laser structure, an anode electrode and a cathode electrode, the laser structure including the substrate and a semiconductor region, the semiconductor region being formed on the semipolar principal surface; scribing a first surface of the substrate product in part in a direction of an a-axis of the hexagonal group-III nitride semiconductor; and carrying out breakup of the substrate product by press against a second surface of the substrate product, to form another substrate product and a laser bar, the first surface being opposite to the second surface, the semiconductor region being located between the first surface and the substrate, the laser bar having first and second end faces, the first and second end faces being formed by the breakup, and the first and second end faces extending from the first surface to the second surface, the first and second end faces constituting a laser cavity of the group-III nitride semiconductor laser device, the anode electrode and the cathode electrode being formed on the laser structure, the semiconductor region comprising a first cladding layer of a first conductivity type gallium nitride-based semiconductor, a second cladding layer of a second conductivity type gallium nitride-based semiconductor and an active layer, the active layer being provided between the first cladding layer and the second cladding layer, the first cladding layer, the second cladding layer, and the active layer being arranged along a normal axis to the semipolar principal surface, the active layer comprising a gallium nitride-based semiconductor layer, a c-axis of the hexagonal group-III nitride semiconductor of the substrate tilting at an angle ALPHA with respect to the normal axis toward an m-axis of the hexagonal group-III nitride semiconductor, the angle ALPHA falling within a range of not less than 45° and not more than 80° or within a range of not less than 100° and not more than 135°, the first and second end faces intersecting with an m-n plane defined by the m-axis of the hexagonal group-III nitride semiconductor and the normal axis, and the first and second end faces including a region such that an angle between this region and a plane indicated by plane index $(-1, 0, 1, L)$ or $(1, 0, -1, -L)$ falls within a range of not less than $-5°$ and not more than $+5°$, with L as an integer number not less than 4. Therefore, the first and second end faces forming the laser cavity mirrors include the region of the plane index such as mentioned above. Thus, these laser cavity mirrors have flatness and perpendicularity, and the lasing yield of the laser cavity can be improved.

In this method, the first and second end faces can include a region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than $-10°$ and not more than $+10°$. Therefore, even when the first and second end faces included in the laser cavity include the region such that the angle formed by this region and the arrangements of N atom-Ga atom of the hexagonal group-III nitride semiconductor of the support base falls within a range of not less than $-10°$ and not more than $+10°$, the first and second end faces have flatness and perpendicularity as a laser cavity mirror, and thus, the lasing yield of the laser cavity can be improved.

In this method, a part of the first and second end faces that is included in the active layer can include a part of or the whole of a region such that an angle between this region and the plane indicated by plane index $(-1, 0, 1, L)$ or $(1, 0, -1, -L)$ falls within a range of not less than $-5°$ and not more than $+5°$. Therefore, the part that is at least included in the active layer on the first and second end faces forming the laser cavity mirrors includes the region of the plane index such as above. Thus, these laser cavity mirrors have flatness and perpendicularity, and the lasing yield of the laser cavity can be improved.

In this method, a part of the first and second end faces that is included in the active layer can include a part of or the whole of a region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than $-10°$ and not more than $+10°$. Even when the part that is at least included in the active layer on the first and second end faces forming the laser cavity mirrors includes the region such that the angle formed by this region and the arrangements of N atom-Ga atom of the hexagonal group-III nitride semiconductor of the support base falls within a range of not less than $-10°$ and not more than $+10°$, the first and second end faces have flatness and perpendicularity as a laser cavity mirror, and thus, the lasing yield of the laser cavity can be improved.

In this method, the angle ALPHA falls within a range of not less than 63° and not more than 80° or within a range of not less than 100° and not more than 117°. In this group-III nitride semiconductor laser device, when the angle ALPHA is in a range of not less than 63° and not more than 80° or in a range of not less than 100° and not more than 117°, it is going to be more likely that the end face formed by the press will be almost perpendicular to the principal surface of the substrate. Furthermore, when the angle is in a range of more than 80° and less than 100°, it might result in failing to achieve desired flatness and perpendicularity.

In this method, the step of forming the substrate product comprises performing processing such as slicing or grinding of the substrate so that a thickness of the substrate becomes not more than 400 μm, and the second surface is one of the following: a processed surface formed by the processing; and a surface including an electrode formed on the processed surface. This group-III nitride semiconductor laser device can be used to obtain a good-quality end face for a laser cavity.

In this method, the step of forming the substrate product comprises polishing the substrate so that a thickness of the substrate becomes not less than 50 μm and not more than 100 μm, and the second surface is one of the following: a polished surface formed by the polishing; and a surface including an electrode formed on the polished surface. When the thickness is not less than 50 μm, handling becomes easier, and production yield becomes higher. When the thickness is in a range of not more than 100 μm, it can be used to obtain a good-quality end face for a laser cavity.

In this method, the scribing is carried out using a laser scriber, and the scribing forms a scribed groove, and a length of the scribed groove is shorter than a length of an intersecting line between the first surface and an a-n plane defined by the normal axis and the a-axis of the hexagonal group-III nitride semiconductor. According to this method, the other substrate product and the laser bar are formed by fracture of the substrate product. This fracture is brought about by using the scribed groove shorter than a fracture line of the laser bar.

In this method, the semipolar principal surface is any one of {20-21} plane, {10-11} plane, {20-2-1} plane, and {10-1-1} plane. According to this method, these typical semipolar surfaces can provide the first and second end faces with flatness and perpendicularity enough to construct the laser cavity of the group-III nitride semiconductor laser device.

In this method, the substrate comprises any one of GaN, AlGaN, AlN, InGaN, and InAlGaN. According to this method, when the substrate used comprises one of these GaN-based semiconductors, it becomes feasible to obtain the first and second end faces applicable to the cavity. Use of an AlN substrate or AlGaN substrate allows for increase in polarization degree and for enhancement of optical confinement by virtue of low refractive index. Use of an InGaN substrate allows for decrease in the degree of lattice mismatch between the substrate and the light emitting layer and for improvement in crystal quality.

The above objects and the other objects, features, and advantages of the present invention can more readily become apparent in view of the following detailed description of the preferred embodiments of the present invention proceeding with reference to the accompanying drawings.

BRIEF DESCRIPTION OF THE DRAWINGS

FIG. 19 is a drawing showing a relation between plane index, angle formed by plane index and the m-plane, angle between the principal surface and the c-plane.

DESCRIPTION OF THE PREFERRED EMBODIMENTS

The expertise of the present invention can be readily understood in view of the following detailed description with reference to the accompanying drawings provided by way of illustration only. The following will describe embodiments of the group-III nitride semiconductor laser device and the method for fabricating the group-III nitride semiconductor laser device according to the present invention, with reference to the accompanying drawings. The same portions will be denoted by the same reference symbols if possible.

Figure 1:
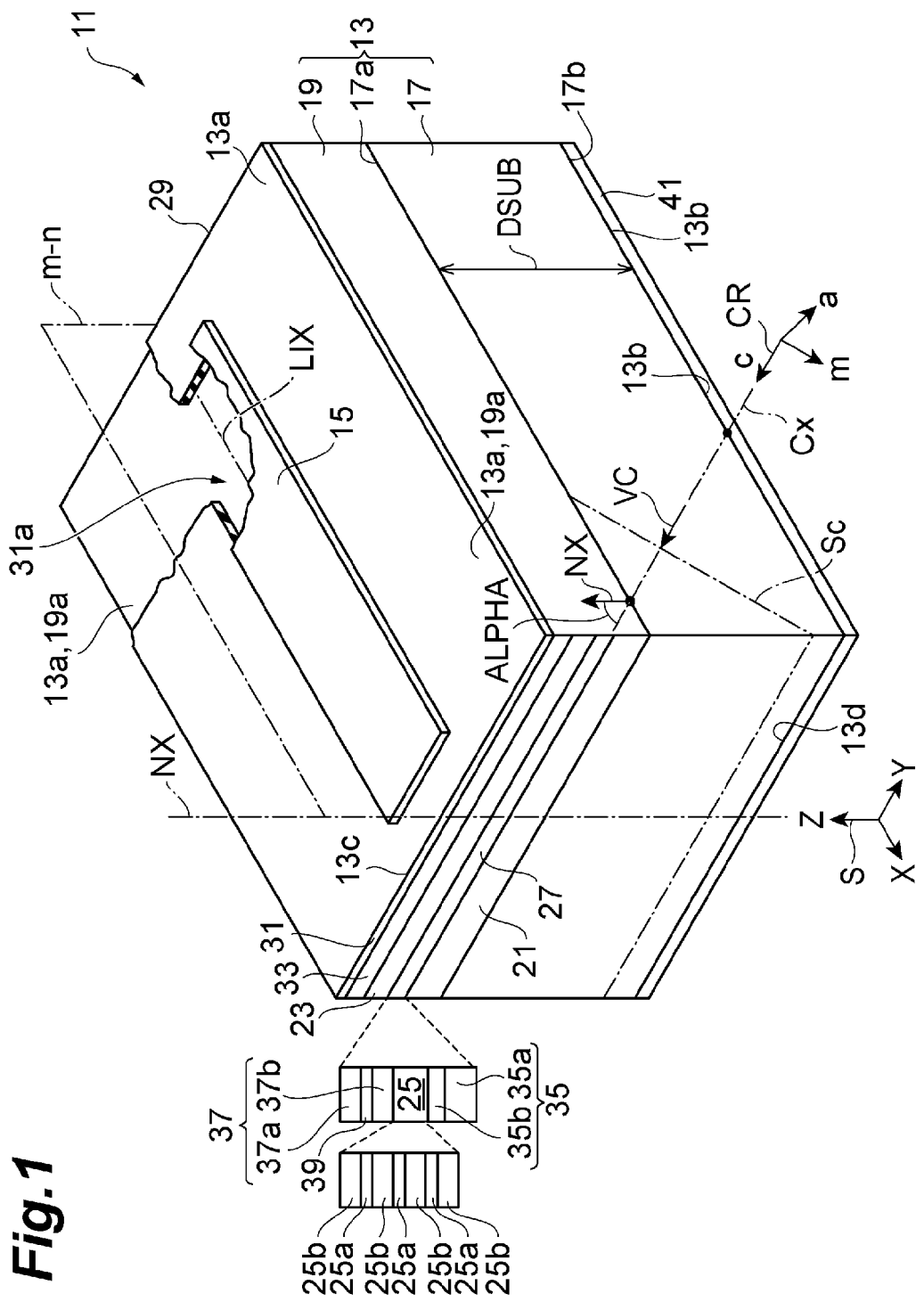
FIG. 1 is a drawing schematically showing a structure of a group-III nitride semiconductor laser device according to an embodiment of the present invention.

FIG. 1 is a drawing schematically showing a structure of a group-III nitride semiconductor laser device according to an embodiment of the present invention. The group-III nitride semiconductor laser device 11 has a gain-guiding type structure, but embodiments of the present invention are not limited to the gain-guiding type structure. The group-III nitride semiconductor laser device 11 has a laser structure 13 and an electrode 15. The laser structure 13 includes a support base 17 and a semiconductor region 19. The support base 17 comprises a hexagonal group-III nitride semiconductor and has a semipolar principal surface 17a and a back surface 17b. The semiconductor region 19 is provided on the semipolar principal surface 17a of the support base 17. The electrode 15 is provided on the semiconductor region 19 of the laser structure 13. The semiconductor region 19 includes a first cladding layer 21, a second cladding layer 23 and an active layer 25. The first cladding layer 21 comprises a first conductivity type gallium nitride based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes gallium nitride based semiconductor layers, and the gallium nitride based semiconductor layers are, for example, well layers 25a. The active layer 25 includes barrier layers 25b of a gallium nitride based semiconductor, and the well layers 25a and the barrier layers 25b are alternately arranged. The well layers 25a comprise, for example, of InGaN or the like and the barrier layers 25b, for example, GaN, InGaN, or the like. The active layer 25 can include a quantum well structure provided so as to generate light at the wavelength of not less than 360 nm and not more than 600 nm, and making use of the semipolar surface is suitably applicable to generation of light at the wavelength of not less than 430 nm and not more than 550 nm. The first cladding layer 21, the second cladding layer 23, and the active layer 25 are arranged along an axis NX normal to the semipolar principal surface 17a. In the group-III nitride semiconductor laser device 11, the laser structure 13 includes a first fractured face 27 and a second fractured face 29, which intersect with an m-n plane defined by the normal axis NX and the m-axis of the hexagonal group-III nitride semiconductor.

Referring to FIG. 1, an orthogonal coordinate system S and a crystal coordinate system CR are depicted. The normal axis NX is directed along a direction of the Z-axis of the orthogonal coordinate system S. The semipolar principal surface 17a extends in parallel with a predetermined plane defined by the X-axis and the Y-axis of the orthogonal coordinate system S. In FIG. 1, a typical c-plane Sc is also depicted. The c-axis of the hexagonal group-III nitride semiconductor of the support base 17 tilts at an angle ALPHA with respect to the normal axis NX toward the m-axis of the hexagonal group-III nitride semiconductor.

The group-III nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 comprises a hexagonal group-III nitride semiconductor. The insulating film 31 has an opening 31a, and the opening 31a extends in a direction of an intersecting line LIX between the surface 19a of the semiconductor region 19 and the foregoing m-n plane, and has, for example, a stripe shape. The electrode 15 is in contact with the surface 19a of the semiconductor region 19 (e.g., a contact layer 33 of the second conductivity type) through the opening 31a, and extends in the direction of the foregoing intersecting line LIX. In the group-III nitride semiconductor laser device 11, a laser waveguide includes the first cladding layer 21, the second cladding layer 23 and the active layer 25, and extends in the direction of the foregoing intersecting line LIX.

In the group-III nitride semiconductor laser device 11, the first fractured face 27 and the second fractured face 29 intersect with the m-n plane defined by the m-axis of the hexagonal group-TEE nitride semiconductor and the normal axis NX. A laser cavity of the group-III nitride semiconductor laser device 11 includes the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The first and second fractured faces 27, 29 extend from an edge 13c of the first surface 13a to an edge 13d of the second surface 13b. The first and second fractured faces 27, 29 are different from the conventional cleaved facets like c-planes, m-planes, or a-planes.

The first and second fractured faces 27, 29 include a region (hereinafter referred to as region R) such that an angle between the region R and the plane indicated by plane index (−1, 0, 1, L) or (1, 0, −1, −L) falls within a range of not less than −5° and not more than +5°, with L as an integer number not less than 4. A part of the first and second fractured faces 27, 29 that is included in the active layer 25 can include a part of or the whole of the region R mentioned above. As the first and second fractured faces 27, 29 included in the laser cavity include the region of such a plane index, the first and second fractured faces 27, 29 have flatness and perpendicularity as a laser cavity mirror, and thus, the lasing yield of the laser cavity can be improved.

Figure 17:
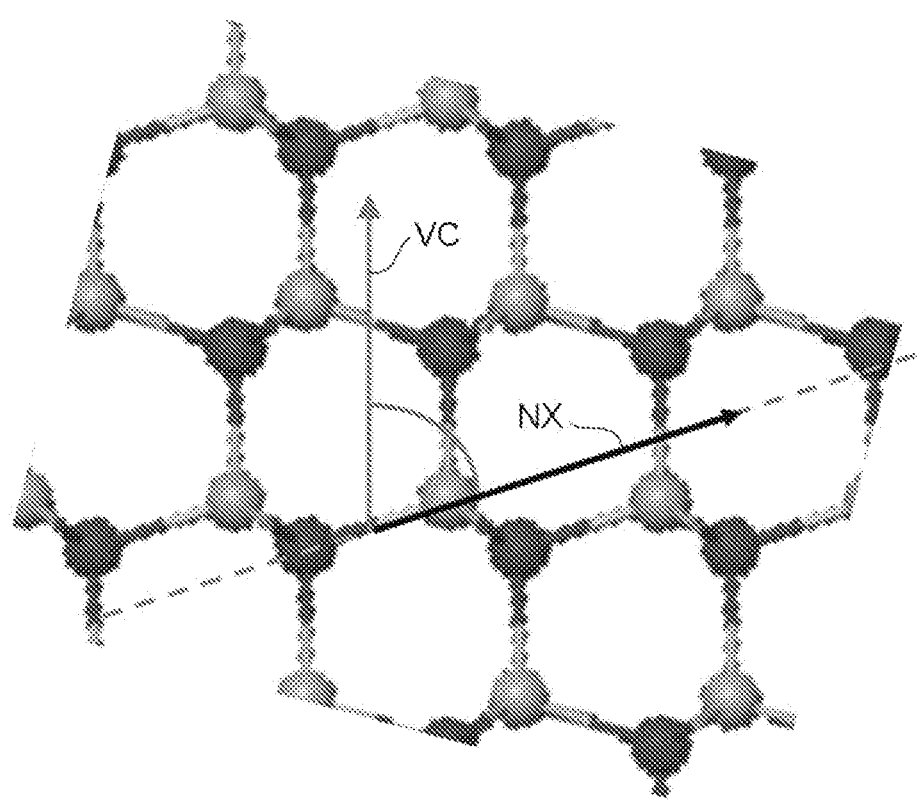
FIG. 17 is a drawing showing atomic arrangements of GaN.

The first and second fractured faces 27, 29 can also include a region such that an angle formed by this region and the arrangements (arrangements extending along the direction of vector NX) of N atom-Ga atom extending toward the direction tilting at an angle of 70.53° in the direction opposite to the direction of the m-axis of the hexagonal group-III nitride semiconductor of the support base 17 with respect to the direction of the c-axis (vector VC) of the hexagonal group-III nitride semiconductor of the support base 17 falls within a range of not less than −10° and not more than +10° (see FIG. 17). A part of the first and second fractured faces 27, 29 that is included in the active layer 25 can include a part of or the whole of the region mentioned above such that an angle formed by this region and the above arrangements (arrangements extending along the direction of vector NX) of N atom-Ga atom of the support base 17 falls within a range of not less than −10° and not more than +10°. Especially, an angle formed by the region R and the arrangements of N atom-Ga atom of the support base 17 extending along the vector NX can fall within a range of not less than −10° and not more than +10°. Even if the first and second fractured faces 27, 29 included in the laser cavity include a region such that an angle formed by this region and the arrangements of N atom-Ga atom of the support base 17 extending along the vector NX is in a range of not less than −10° and not more than +10°, the first and second fractured faces 27, 29 have flatness and perpendicularity as a laser cavity mirror, and thus, the lasing yield of the laser cavity can be improved.

The table shown in FIG. 19 can be seen as indicating a relation between an angle (angle ALPHA) formed by the semipolar principal surface 17a of the support base 17 and the c-plane (plane Sc) of the hexagonal group-III nitride semiconductor of the support base 17, and plane indices of planes which are orthogonal to the semipolar principal surface 17a and extend along the first and second fractured faces 27, 29. Referring to FIG. 19, in the present embodiment, the angle (angle ALPHA) between the semipolar principal surface 17a of the support base 17 and the c-plane (plane Sc) of the hexagonal group-III nitride semiconductor of the support base 17 is in a range of not less than 64.84±5° and not more than 79.37±5°. As can be seen, even when the angle (angle ALPHA) between the semipolar principal surface 17a of the support base 17 and the c-plane (plane Sc) of the hexagonal group-III nitride semiconductor of the support base 17 is in a range of not less than 64.84±5° and not more than 79.37±5°, the first and second fractured faces 27, 29 have flatness and perpendicularity as a laser cavity mirror, and thus, the lasing yield of the laser cavity can be improved.

In this group-III nitride semiconductor laser device 11, the first and second fractured faces 27, 29 that form the laser cavity intersect with the m-n plane. This allows for provision of the laser waveguide extending in the direction of the intersecting line between the m-n plane and the semipolar surface 17a. For this reason, the group-III nitride semiconductor laser device 11 has the laser cavity enabling a low threshold current.

The group-III nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, of GaN, InGaN, or the like. The p-side optical guide layer 37 includes a first portion 37a and a second portion 37b, and the p-side optical guide layer 37 comprises, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 2:
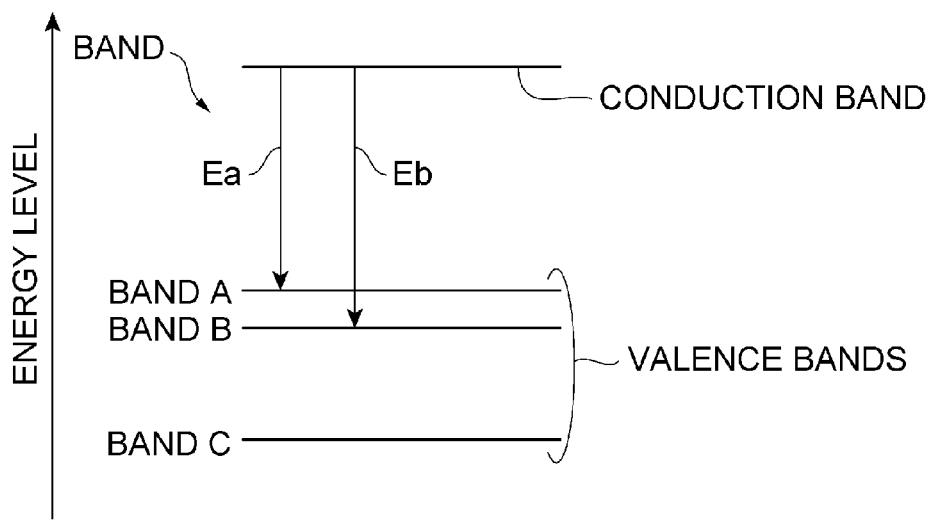
FIG. 2 is a drawing showing a band structure in an active layer in the group-III nitride semiconductor laser device.
Figure 2:
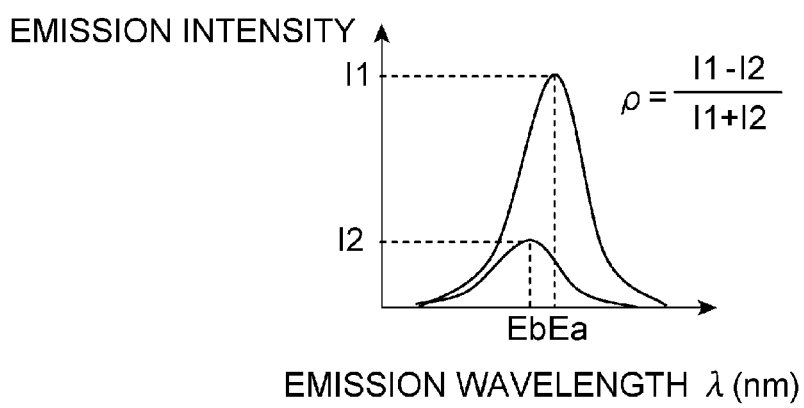
Figure 3:
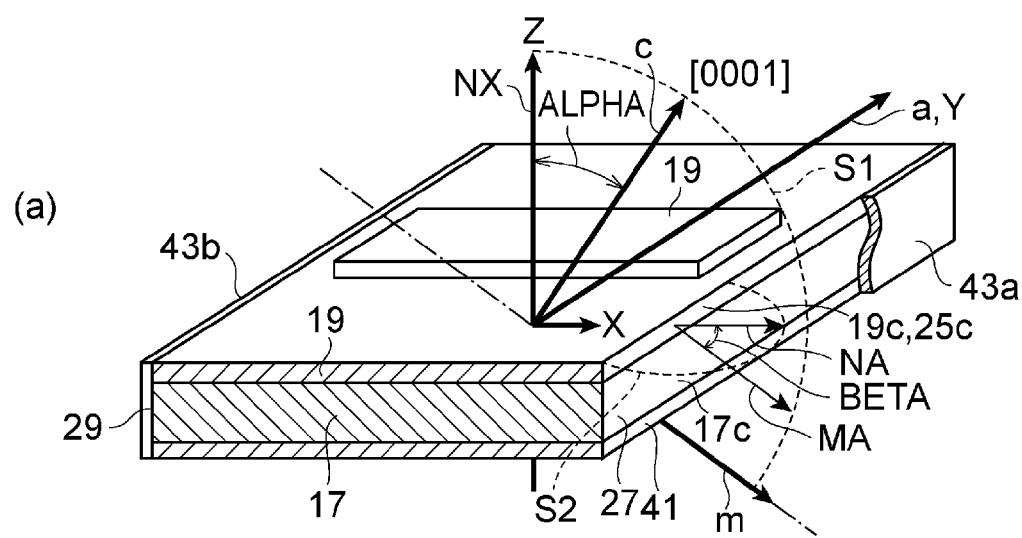
FIG. 3 is a drawing showing polarization of emission in the active layer of the group-III nitride semiconductor laser device.
Figure 3:
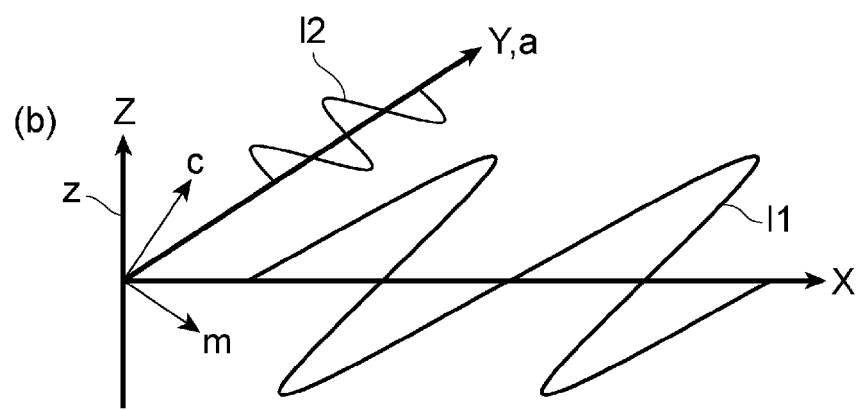
Figure 4:
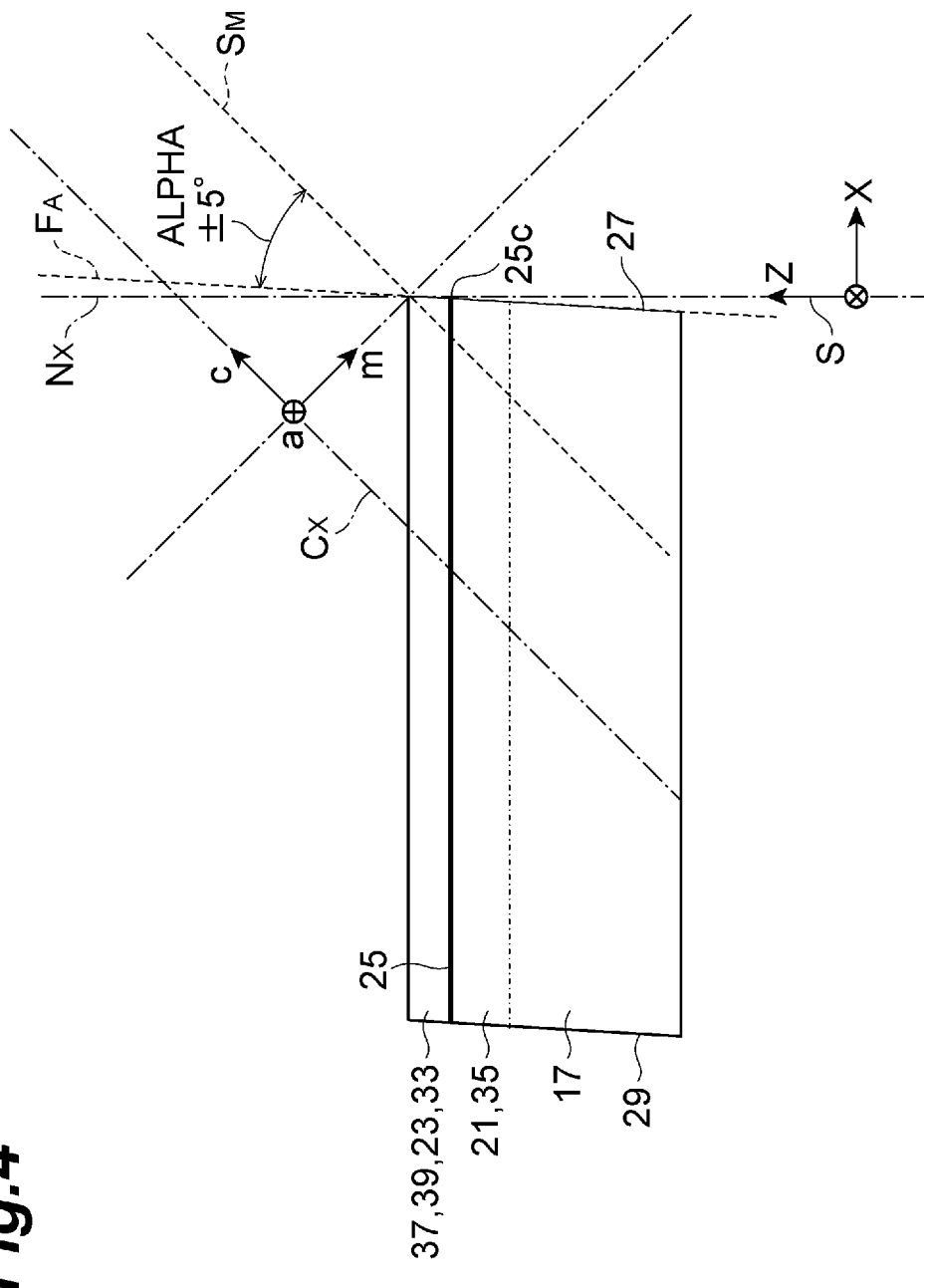
FIG. 4 is a drawing showing a relation between an end face of the group-III nitride semiconductor laser device and an m-plane of the active layer.

FIG. 2 is a drawing showing a band structure in the active layer in the group-III nitride semiconductor laser device. FIG. 3 is a drawing showing polarization of emission from the active layer 25 of the group-III nitride semiconductor laser device 11. FIG. 4 is a schematic cross sectional view taken along a plane defined by the c-axis and the m-axis. With reference to Part (a) of FIG. 2, three possible transitions between the conduction band and valence bands in the vicinity of Γ point of the band structure BAND are shown. The energy difference between band A and band B is relatively small. An emission by transition Ea between the conduction band and band A is polarized in the a-axis direction, and an emission by transition Eb between the conduction band and band B is polarized in a direction of the c-axis projected onto the principal surface. Concerning lasing, a threshold of transition Ea is smaller than a threshold of transition Eb.

With reference to Part (b) of FIG. 2, there are shown spectra of light in the LED mode in the group-III nitride semiconductor laser device 11. The light in the LED mode includes a polarization component I1 in the direction of the a-axis of the hexagonal group-III nitride semiconductor, and a polarization component I2 in the direction of the projected c-axis of the hexagonal group-III nitride semiconductor onto the principal surface, and the polarization component I1 is larger than the polarization component I2. Polarization degree ρ is defined by (I1−I2)/(I1+I2). The laser cavity of the group-III nitride semiconductor laser device 11 enables the device to emit a laser beam in the mode that has large emission intensity in the LED mode.

As shown in FIG. 3, the device may be further provided with dielectric multilayer film 43a, 43b on at least one of the first and second fractured faces 27, 29 or on the respective faces. An end face coating is also applicable to the fractured faces 27, 29. The end face coating allows adjustment of their reflectance.

As shown in Part (b) of FIG. 3, the laser light L from the active layer 25 is polarized in the direction of the a-axis of the hexagonal group-III nitride semiconductor. In this group-III nitride semiconductor laser device 11, a band transition allowing for implementation of a low threshold current has polarized nature. The first and second fractured faces 27, 29 for the laser cavity are different from the conventional cleaved facets like c-planes, m-planes, or a-planes. But, the first and second fractured faces 27, 29 have flatness and perpendicularity as mirrors for laser cavity. For this reason, by using the first and second fractured faces 27, 29 and the laser waveguide extending between these fractured faces 27, 29, as shown in Part (b) of FIG. 3, it becomes feasible to achieve low-threshold lasing through the use of the emission by transition Ea stronger than the emission by transition Eb that is polarized in the direction indicated by the c-axis projected onto the principal surface.

In the group-III nitride semiconductor laser device 11, an end face 17c of the support base 17 and an end face 19c of the semiconductor region 19 are exposed in each of the first and second fractured faces 27, 29, and the end face 17c and the end face 19c are covered with the dielectric multilayer film 43a. An angle BETA between an rn-axis vector MA of the active layer 25 and a vector NA normal to the end face 17c of the support base 17, and an end face 25c in the active layer 25 has a component $(BETA)_1$ defined on a first plane S1, which is defined by the c-axis and m-axis of the group-III nitride semiconductor, and a component $(BETA)_2$ defined on a second plane S2 (which is not shown but is referred to as "S2" for easier understanding), which is perpendicular to the first plane S1 (which is not shown but is referred to as "S1" for easier understanding) and the normal axis NX. The component $(BETA)_1$ is preferably in a range of not less than (ALPHA−5)° and not more than (ALPHA+5)° in the first plane S1 defined by the c-axis and m-axis of the group-III nitride semiconductor. This angular range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This group-III nitride semiconductor laser device 11 has the end faces in which the angle BETA taken from one of the c-axis and the m-axis to the other satisfies the aforementioned perpendicularity. The component $(BETA)_2$ is preferably in a range of not less than −5° and not more than +5° on the second plane S2. Here, $BETA^2 = (BETA)_1^2 + (BETA)_2^2$. The end faces (the fractured faces 27, 29) of the group-III nitride semiconductor laser device 11 satisfy the aforementioned perpendicularity as to the in-plane angle defined in the plane that is perpendicular to the normal axis NX to the semipolar surface 17a.

Referring again to FIG. 1, in the group-III nitride semiconductor laser device 11, the thickness DSUB of the support base 17 is preferably not more than 400 μm. This group-III nitride semiconductor laser device can provide good-quality fractured faces for the laser cavity. In the group-III nitride semiconductor laser device 11, the thickness DSUB of the support base 17 is more preferably not less than 50 μm and not more than 100 μm. This group-III nitride semiconductor laser device 11 can be provided good-quality fractured faces more preferred for the laser cavity. Furthermore, its handling becomes easier and the production yield can be improved.

In the group-III nitride semiconductor laser device 11, the angle ALPHA between the normal axis NX and the c-axis of the hexagonal group-III nitride semiconductor is preferably not less than 45° and preferably not more than 80°, and the angle ALPHA is preferably not less than 100° and preferably not more than 135°. When the angle is in a range of less than 45° and in a range of more than 135°, the end faces made by press are highly likely to be comprised of m-planes. When the angle is in a range of more than 80° and less than 100°, it could result in failing to achieve desired flatness and perpendicularity.

In the group-III nitride semiconductor laser device 11, more preferably, the angle ALPHA between the normal axis. NX and the c-axis of the hexagonal group-III nitride semiconductor is not less than 63° and not more than 80°. Furthermore, the angle ALPHA is particularly preferably not less than 100° and not more than 117°. When the angle is in a range of less than 63° and in a range of more than 117°, an m-plane can be formed in part of an end face made by press. When the angle is in a range of more than 80° and less than 100°, it could result in failing to achieve desired flatness and perpendicularity.

The semipolar principal surface 17a can be any one of {20-21} plane, {10-11} plane, {20-2-1} plane and {10-1-1} plane. Furthermore, a surface with a slight tilt in a range of not less than −4° and not more than +4° with respect to these planes may also be applied as the principal surface. On the semipolar surface 17a of one of these typical planes, it is feasible to provide the first and second end faces (fractured faces 27, 29) with flatness and perpendicularity enough to construct the laser cavity of the group-III nitride semiconductor laser device 11. Furthermore, end faces with sufficient flatness and perpendicularity are obtained in an angular range across these typical plane orientations.

In the group-III nitride semiconductor laser device 11, the stacking fault density of the support base 17 can be not more than $1 \times 10^4$ cm$^{-1}$. Since the stacking fault density is not more than $1\times10^4$ cm$^{-1}$, the flatness and/or perpendicularity of the fractured faces is less likely to be disturbed for a certain accidental reason. The support base 17 can comprise any one of GaN, AlN, AlGaN, InGaN, and InAlGaN. When the substrate of any one of these GaN-based semiconductors is used, the end faces (fractured faces 27, 29) applicable to the cavity can be obtained. When an MN or AlGaN substrate is used, it is feasible to increase the polarization degree and to enhance optical confinement by virtue of low refractive index. When an InGaN substrate is used, it is feasible to decrease degree of the lattice mismatch between the substrate and the light emitting layer and to improve crystal quality.

Figure 5:
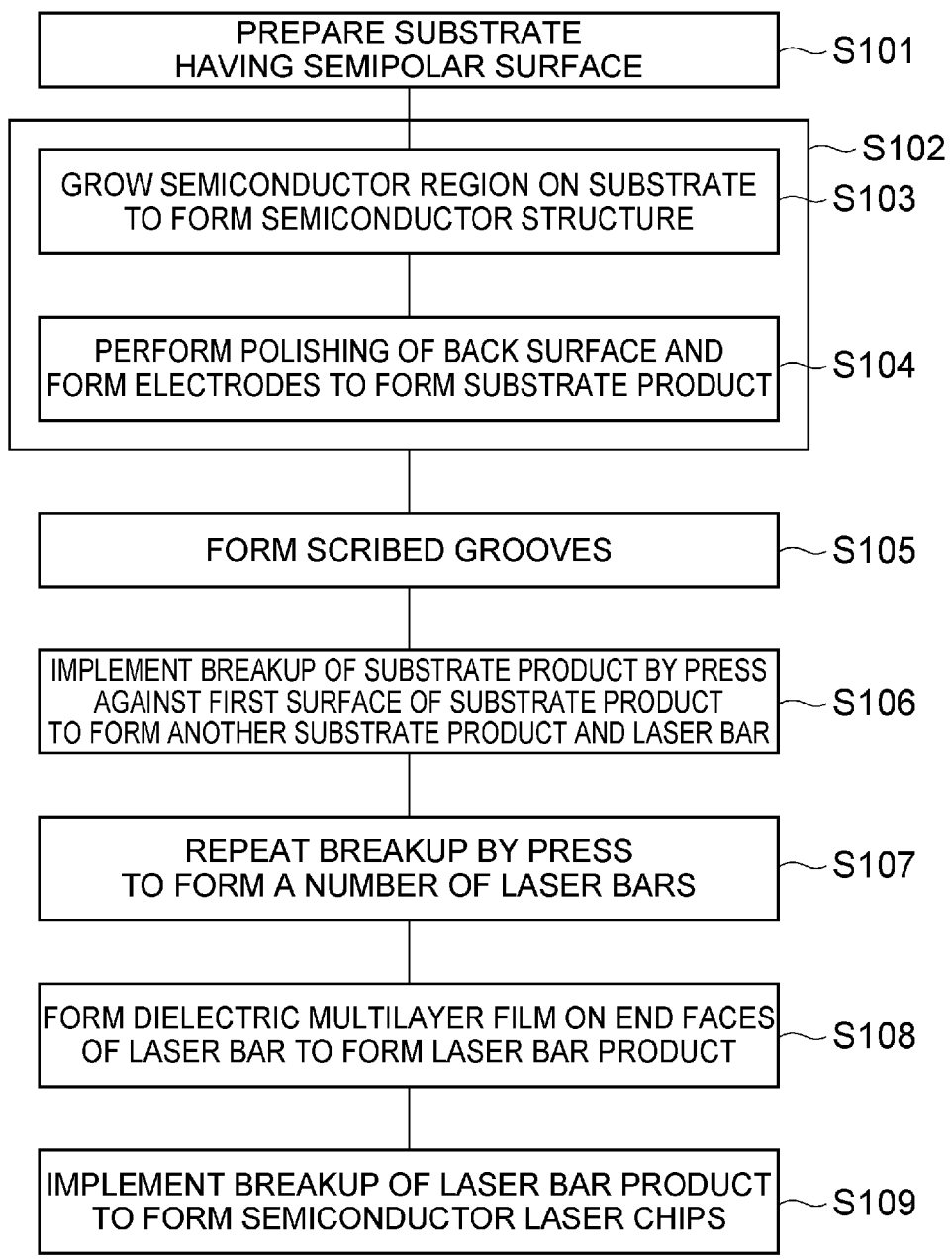
FIG. 5 is a flowchart showing major steps in a method for fabricating the group-III nitride semiconductor laser device according to the embodiment.

FIG. 5 is a drawing showing major steps in a method for fabricating the group-III nitride semiconductor laser device according to the present embodiment. With reference to Part (a) of FIG. 6, a substrate 51 is shown. In step S101, the substrate 51 is prepared for fabrication of the group-III nitride semiconductor laser device. The c-axis (vector VC) of the hexagonal group-III nitride semiconductor of the substrate 51 tilts at an angle ALPHA with respect to the normal axis NX toward the rn-axis (vector VM) of the hexagonal group-III nitride semiconductor. Accordingly, the substrate 51 has a semipolar principal surface 51a of the hexagonal group-III nitride semiconductor.

In step S102, a substrate product SP is formed. In Part (a) of FIG. 6, the substrate product SP is depicted as a member of a nearly disklike shape, but the shape of the substrate product SP is not limited thereto. For obtaining the substrate product SP, step S103 is first performed to form a laser structure 55. The laser structure 55 includes a semiconductor region 53 and the substrate 51, and in step S103, the semiconductor region 53 is grown on the semipolar principal surface 51a. For forming the semiconductor region 53, a first conductivity type GaN-based semiconductor region 57, a light emitting layer 59, and a second conductivity type GaN-based semiconductor region 61 are grown sequentially on the semipolar principal surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The GaN-based semiconductor region 57, the light emitting layer 59, and the second conductivity type GaN-based semiconductor region 61 are arranged in the direction of the normal axis NX to the semipolar principal surface 51a. These semiconductor layers are epitaxially grown thereon. The surface of the semiconductor region 53 is covered with an insulating film 54. The insulating film 54 comprises, for example, of silicon oxide. The insulating film 54 has an opening 54a. The opening 54a has, for example, a stripe shape.

Step S104 is carried out to form an anode electrode 58a and a cathode electrode 58b on the laser structure 55. Before forming the electrode on the back surface of the substrate 51, the back surface of the substrate used in crystal growth is polished to form a substrate product SP in desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. After these steps, the substrate product SP is obtained. The substrate product SP includes a first surface 63a, and a second surface 63b located opposite thereto. The semiconductor region 53 is located between the first surface 63a and the substrate 51.

Figure 6:
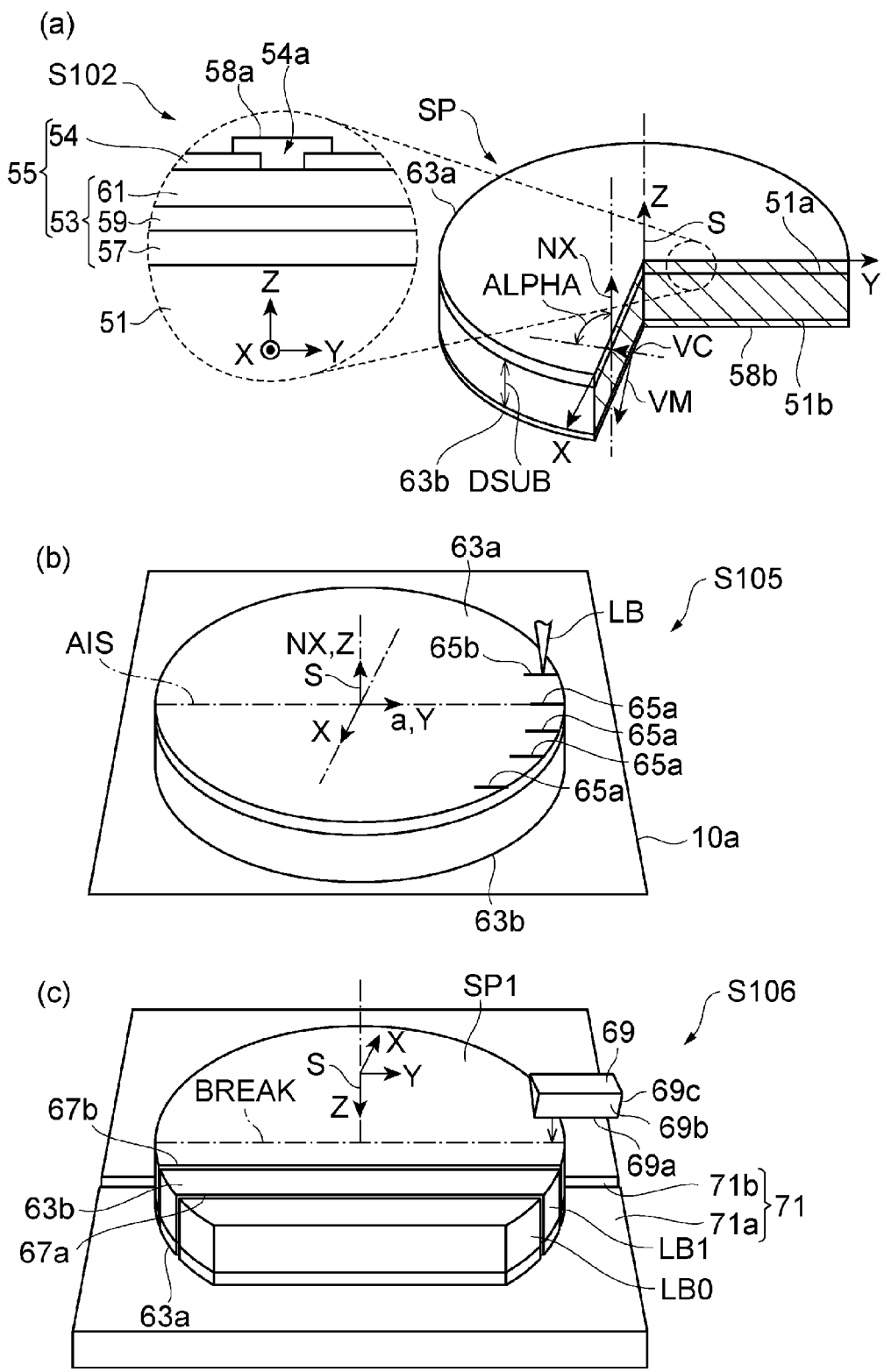
FIG. 6 is a drawing schematically showing major steps in the method for fabricating the group-III nitride semiconductor laser device according to the embodiment.

Step S105 is carried out, as shown in Part (b) of FIG. 6, to scribe the first surface 63a of the substrate product SP. This scribing step is carried out with a laser scriber 10a. This scribing step forms scribed grooves 65a. In Part (b) of FIG. 6, five scribed grooves are already formed, and formation of a scribed groove 65b is in progress with laser beam LB. The length of the scribed grooves 65a is shorter than the length of an intersecting line AIS between the first surface 63a and an a-n plane defined by the normal axis NX and the a-axis of the hexagonal group-III nitride semiconductor, and the laser beam LB is applied to a part of the intersecting line AIS. By the application with the laser beam LB, grooves extending in the specific direction and reaching the semiconductor region are formed in the first surface 63a. The scribed grooves 65a can be formed, for example, in an edge of the substrate product SP.

As shown in Part (c) of FIG. 6, step S106 is carried out to implement breakup of the substrate product SP by press against the second surface 63b of the substrate product SP, thereby forming a substrate product SP1 and a laser bar LB1. The press is carried out with a breaking device, such as, a blade 69. The blade 69 includes an edge 69a extending in one direction, and at least two blade faces 69b and 69c that are formed to define the edge 69a. The pressing onto the substrate product SP1 is carried out on a support device 71. The support device 71 includes a support table 71a and a recess 71b, and the recess 71b extends in one direction. The recess 71b is formed in the support table 71a. The orientation and position of the scribed groove 65a of the substrate product SP1 are aligned with the extending direction of the recess 71b of the support device 71 to position the substrate product SP1 to the recess 71b on the support device 71. The orientation of the edge of the breaking device is aligned with the extending direction of the recess 71b, and the edge of the breaking device is pressed against the substrate product SP1 from a direction intersecting with the second surface 63b. The intersecting direction is preferably an approximately vertical direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to mirrors for the laser cavity of the semiconductor laser.

The laser bar LB1 thus formed has the first and second end faces 67a, 67b formed by the aforementioned breakup, and each of the end faces 67a, 67b extends from the first surface 63a to the second surface 63b. The end faces 67a, 67b form the laser cavity of the group-III nitride semiconductor laser device, and intersect with the XZ plane. This XZ plane corresponds to the m-n plane defined by the normal axis NX and the m-axis of the hexagonal group-III nitride semiconductor.

The first and second end faces 67a, 67b include a region (hereinafter referred to as region R1) such that an angle between the region R1 and the plane indicated by plane index (−1, 0, 1, L) or (1, 0, −1, −L) falls within a range of not less than −5° and not more than +5°, with L as an integer number not less than 4. A part of the first and second end faces 67a, 67b that is included in the active layer of the light emitting layer 59 can include a part of or the whole of the region R1 mentioned above. As the first and second end faces 67a, 67b included in the laser cavity include the region of such a plane index, the first and second end faces 67a, 67b have flatness and perpendicularity as a laser cavity mirror, and thus, the lasing yield of the laser cavity can be improved.

The first and second end faces 67a, 67b can also include a region such that an angle formed by this region and the arrangements (arrangements extending along the direction of vector NX) of N atom-Ga atom extending toward the direction tilting at an angle of 70.53° in the direction opposite to the direction of the maxis of the hexagonal group-III nitride semiconductor of the substrate 51 with respect to the direction of the c-axis (vector VC) of the hexagonal group-III nitride semiconductor of the substrate 51, falls within a range of not less than −10° and not more than +10° (see FIG. 17). A part of the first and second end faces 67a, 67b that is included in the active layer of the light emitting layer 59 can include a part of or the whole of the region mentioned above such that an angle formed by this region and the above arrangements (arrangements extending along the direction of vector NX) of N atom-Ga atom of the substrate 51 falls within a range of not less than −10° and not more than +10°. Especially, an angle formed by the region R1 and the arrangements of N atom-Ga atom of the substrate 51 extending along the vector NX can fall within a range of not less than −10° and not more than +10°. Even if the first and second end faces 67a, 67b included in the laser cavity include a region such that an angle formed by this region and the arrangements of N atom-Ga atom of the substrate 51 extending along the vector NX is in a range of not less than −10° and not more than +10°, the first and second end faces 67a, 67b have flatness and perpendicularity as a laser cavity mirror, and thus, the lasing yield of the laser cavity can be improved.

The table shown in FIG. 19 can be seen as indicating a relation between an angle (angle ALPHA) formed by the semipolar principal surface 51a of the substrate 51 and the c-plane (plane Sc) of the hexagonal group-III nitride semiconductor of the substrate 51, and plane indices of planes which are orthogonal to the semipolar principal surface 51a and extend along the first and second end faces 67a, 67b. Referring to FIG. 19, in the present embodiment, the angle (angle ALPHA) between the semipolar principal surface 51a of the substrate 51 and the c-plane (plane Sc) of the hexagonal group-III nitride semiconductor of the substrate 51 is in a range of not less than 64.84±5° and not more than 79.37±5°. As can be seen, even when the angle (angle ALPHA) between the semipolar principal surface 51a of the substrate 51 and the c-plane (plane Sc) of the hexagonal group-III nitride semiconductor of the substrate 51 is in a range of not less than 64.84±5° and not more than 79.37±5°, the first and second end faces 67a, 67b have flatness and perpendicularity as a laser cavity mirror, and thus, the lasing yield of the laser cavity can be improved.

By use of this method, the first surface 63a of the substrate product SP is scribed in the direction of the a-axis of the hexagonal group-III nitride semiconductor, and thereafter the breakup of the substrate product SP is carried out by press against the second surface 63b of the substrate product SP, thereby forming the new substrate product SP1 and the laser bar LB1. This method allows the formation of the first and second end faces 67a, 67b, which intersect with the m-n plane, in the laser bar LB1. This end face forming method provides the first and second end faces 67a, 67b with flatness and perpendicularity enough to construct the laser cavity of the group-III nitride semiconductor laser device.

In this method, the laser waveguide thus formed extends in the direction of tilt of the c-axis of the hexagonal group-III nitride. The end faces of the laser cavity mirror allowing for provision of this laser waveguide are formed without use of dry-etching.

This method involves the fracturing of the substrate product SP1, thereby forming the new substrate product SP1 and the laser bar LB1. In Step S107, the breakup is repeatedly carried out by press to produce a number of laser bars. This fracture propagates along the scribed grooves 65a shorter than a fracture line BREAK of the laser bar LB1.

In Step S108, dielectric multilayer films is formed on the end faces 67a, 67b of the laser bar LB1 to form a laser bar product. In Step S109, this laser bar product is separated into individual semiconductor laser dies.

In the fabrication method according to the present embodiment, the angle ALPHA can be in a range of not less than 45° and not more than 80° and in a range of not less than 100° and not more than 135°. When the angle is in a range of less than 45° and in a range of more than 135°, the end face made by press becomes highly likely to be comprised of an m-plane. When the angle is in a range of more than 80° and less than 100°, it may result in failing to achieve desired flatness and perpendicularity. More preferably, the angle ALPHA can be in a range of not less than 63° and not more than 80° and in a range of not less than 100° and not more than 117°. When the angle is in a range of less than 45° and in a range of more than 135°, an m-plane can be formed in part of an end face formed by press. When the angle is in a range of more than 80° and less than 100°, it may result in failing to achieve desired flatness and perpendicularity. The semipolar principal surface 51a can be any one of {20-21} plane, {10-11} plane, {20-2-1} plane, and {10-1-1} plane. Furthermore, a surface slightly tilted in a range of not less than −4° and not more than +4° from the above planes is also used as the principal surface. On these typical semipolar surfaces, it is feasible to provide the end faces for the laser cavity with flatness and perpendicularity enough to construct the laser cavity of the group-III nitride semiconductor laser device.

The substrate 51 can be made of any one of GaN, AlN, AlGaN, InGaN, and InAlGaN. When any one of these GaN-based semiconductors is used for the substrate, it is feasible to obtain the end faces applicable to the laser cavity. The substrate 51 is preferably made of GaN.

In the step S104 of forming the substrate product SP, the semiconductor substrate used in crystal growth can be one subjected to processing such as slicing or grinding so that the substrate thickness becomes not more than 400 μm, whereby the second surface 63b of the semiconductor substrate becomes a processed surface formed by polishing. In this substrate thickness, the end faces 67a, 67b can be formed in good yield, and are provided with flatness and perpendicularity enough to construct the laser cavity of the group-III nitride semiconductor laser device or without ion damage. More preferably, the second surface 63b can be is a polished surface formed by polishing, and the thickness of the polished substrate is not more than 100 μm. For facilitating to handle the substrate product SP, the substrate thickness is preferably not less than 50 μm.

In the production method of the laser end faces according to the present embodiment, the angle BETA explained with reference to FIG. 3 can be also defined in the laser bar LB1. In the laser bar LB1, the component $(BETA)_1$ of the angle BETA is preferably in a range of not less than (ALPHA−5)° and not more than (ALPHA+5)° on a first plane (plane corresponding to the first plane S1 in the description with reference to FIG. 3) defined by the c-axis and m-axis of the group-III nitride semiconductor. The end faces 67a, 67b of the laser bar LB1 satisfy the aforementioned perpendicularity as to the angle component of the angle BETA taken from one of the c-axis and the m-axis to the other. The component $(BETA)_2$ of the angle BETA is preferably in a range of not less than −5° and not more than +5° on a second plane (plane corresponding to the second plane S2 shown in FIG. 3). These end faces 67a, 67b of the laser bar LB1 also satisfy the aforementioned perpendicularity as to the angle component of the angle BETA defined on the plane perpendicular to the normal axis NX to the semipolar surface 51a.

The end faces 67a, 67b are formed by break by press against the plurality of GaN-based semiconductor layers epitaxially grown on the semipolar surface 51a. Since they are epitaxial films on the semipolar surface 51a, each of the end faces 67a, 67b are not cleaved facets each having a low plane index like c-planes, m-planes, or a-planes which have been used heretofore for the conventional laser cavity mirrors. However, through the break of the stack of epitaxial films on the semipolar surface 51a, the end faces 67a, 67b have flatness and perpendicularity applicable as laser cavity mirrors.

EXAMPLE 1

A GaN substrate with a semipolar surface is prepared, and perpendicularity of a fractured face is observed as described below. The above substrate used has a {20-21}-plane GaN substrate formed by cutting a (0001) GaN ingot, thickly grown by HYPE, at the angle of 75° to the m-axis. The principal surface of the GaN substrate is mirror-finished, and the back surface has pear-skin which is finished by grinding. The thickness of the substrate is 370 μm.

On the back side in the pear-skin finish, a marking line is drawn, with a diamond pen, perpendicularly to the direction of the c-axis projected on the principal surface of the substrate, and thereafter the substrate is fractured by press. For observing the perpendicularity of the resultant fractured face, the substrate is observed from the a-plane direction with a scanning electron microscope.

Figure 7:
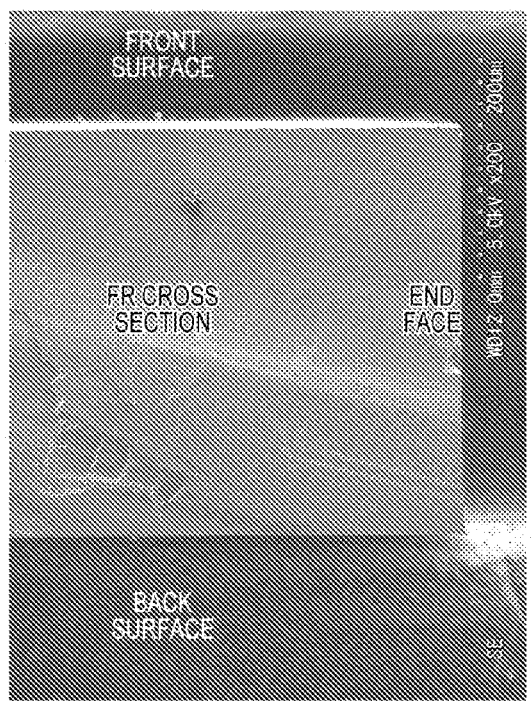
FIG. 7 is a drawing showing a scanning electron microscope image of a cavity end face, along with a {20-21} plane in crystal lattices.
Figure 7:
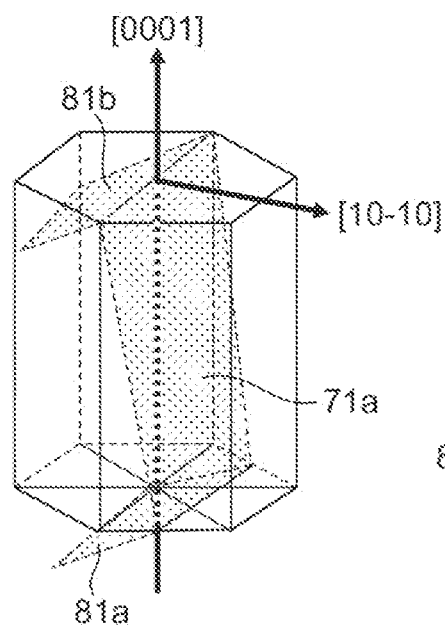
Figure 7:
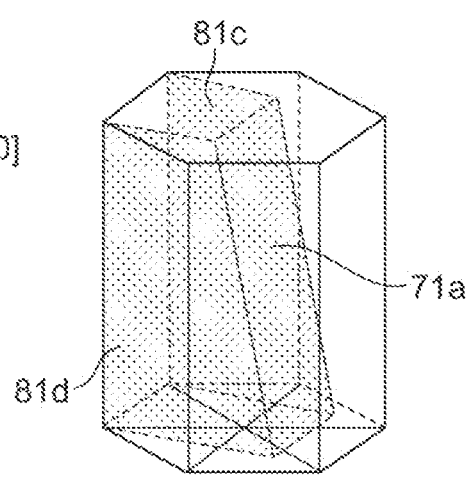

Part (a) of FIG. 7 shows a scanning electron microscope image of the fractured face observed from the a-plane direction, and the fractured face is shown as the right end face. As seen from the image, the fractured face has flatness and perpendicularity to the semipolar principal surface.

EXAMPLE 2

Figure 8:
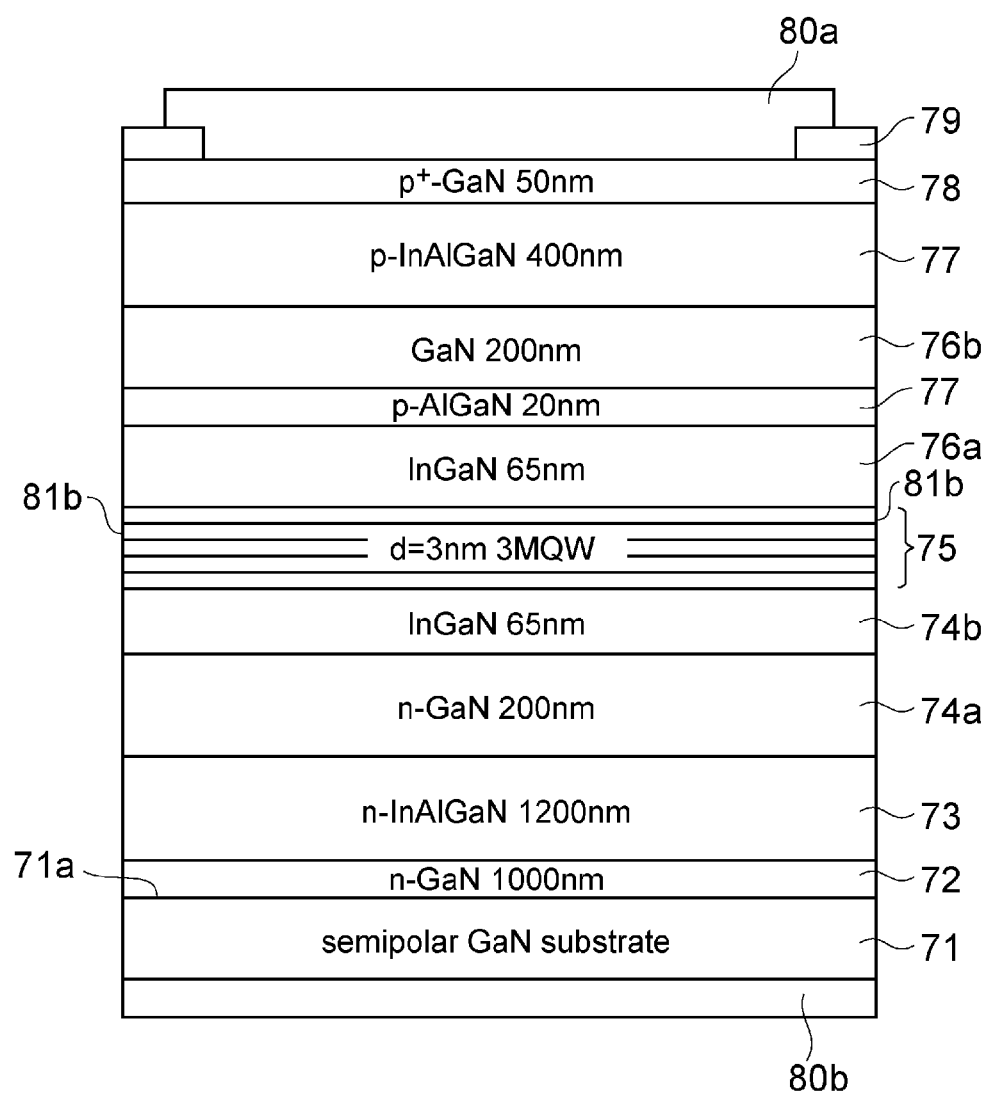
FIG. 8 is a drawing showing a structure of a laser diode shown in Example 1.

It is found in Example 1 that in the GaN substrate having the semipolar {20-21} plane, the fractured face is obtained by pressing the substrate after drawing the marking line perpendicular to the projected direction of the c-axis onto the principal surface of the substrate, and has the flatness and perpendicularity to the principal surface of the substrate. For estimating applicability of this fractured face to the laser cavity, a laser diode shown in FIG. 8 is grown by organometallic vapor phase epitaxy as described below. The raw materials used are as follows: trimethyl gallium (TMGa); trimethyl aluminum (TMAl); trimethyl indium (TMIn); ammonia ($NH_3$); and silane ($SiH_4$). A substrate 71 is prepared. A GaN substrate is prepared as the substrate 71, and the GaN substrate is cut with a wafer slicing apparatus at an angle in a range of 0° to 90° to the m-axis from a (0001) GaN ingot thickly grown by HYPE, in such a manner that the angle ALPHA of the c-axis tilted toward the m-axis has a desired off angle in a range of 0° to 90°. For example, when the substrate is formed by cutting at the angle of 75°, the resultant substrate is prepared as a GaN substrate having a {20-21}-plane, and it is represented by reference symbol 71a in the hexagonal crystal lattice shown in Part (b) of FIG. 7.

Before the growth, the substrate is observed by the cathodoluminescence method in order to estimate the stacking fault density of the substrate. In the cathodoluminescence, an emission process of carriers excited by an electron beam is observed and in a stacking fault, non-radiative recombination of carriers occurs in the vicinity thereof, so that the stacking fault is expected be observed as a dark line. The stacking fault density is defined as a density (line density) per unit length of dark lines observed. The cathodoluminescence method of nondestructive measurement is applied herein in order to estimate the stacking fault density, but it is also possible to use destructive measurement, such as a transmission electron microscope. When a cross section of a sample is observed from the a-axis direction with the transmission electron microscope, a defect extending in the m-axis direction from the substrate toward the sample surface indicates a stacking fault contained in the support base, and the line density of stacking faults can be determined in the same manner as in the cathodoluminescence method.

The above substrate 71 is placed on a susceptor in a reactor, and the epitaxial layers are grown in the following growth procedure. First, an n-type GaN 72 is grown thereon and its the thickness is 1000 nm. Next, an n-type InAlGaN cladding layer 73 is grown thereon and its thickness is 1200 nm. Thereafter, an n-type GaN guide layer 74a and an undoped InGaN guide layer 74b are grown, their thickness are 200 nm and 65 nm, respectively, and then a three-cycle MQW 75 constituted by GaN 15 nm thick/InGaN 3 nm thick is grown thereon. Subsequently grown thereon are an undoped InGaN guide layer 76a of the thickness of 65 nm, a p-type AlGaN block layer 77 of the thickness of 20 nm, and a p-type GaN guide layer 76b of the thickness of 200 nm. Then, a p-type InAlGaN cladding layer 77 is grown thereon, and its thickness is 400 nm. Finally, a p-type GaN contact layer 78 is grown thereon and its thickness is 50 nm.

An insulating film 79 of $SiO_2$ is deposited on the contact layer 78 and then photolithography and wet etching processes are applied to form a stripe window having the width of 10 μm in the insulating film 79. In this step, two types of contact windows are formed in two stripe directions, respectively. These laser stripes are formed in the following directions: (1) M-direction (direction of the contact window extending along the predetermined plane defined by the c-axis and the m-axis); and (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using diamond slurry to produce a substrate product with the mirror-polished back surface. Then, the thickness of the thus formed substrate product is measured with a contact film thickness meter. The measurement of substrate thickness may also be carried out with a microscope from the observation of a cross section of a prepared sample. The microscope applicable herein can be an optical microscope or a scanning electron microscope. An n-side electrode 80b of Ti/Al/Ti/Au is formed by vapor deposition on the back surface (polished surface) of the GaN substrate (GaN wafer).

The laser cavity mirrors for these two types of laser stripes are produced with a laser scriber that uses the YAG laser at the wavelength of 355 nm. When the break is implemented with the laser scriber, the laser chip yield can be improved as compared with break implemented using a diamond scriber. The conditions for formation of the scribed grooves are as follows: laser beam output power of 100 mW; scanning speed of 5 mm/s. The scribed grooves thus formed each has, for example, the length of 30 μm, the width of 10 μm, and the depth of 40 μm. The scribed grooves are formed by applying the laser beam through the aperture of the insulating film of the substrate directly to the epitaxially grown surface at the pitch of 800 μm. The cavity length is 600 μm.

The laser cavity mirrors are made through fracture by use of a blade. A laser bar is produced by break by press against the back side of the substrate. More specifically, Parts (b) and (c) of FIG. 7 show relations between crystal orientations and fractured faces, for the {20-21}-plane GaN substrate. Part (b) of FIG. 7 shows the laser stripe that is provided to extend (1) in the M-direction, and shows end faces 81a, 81b for the laser cavity along with the semipolar surface 71a. The end faces 81a, 81b are approximately perpendicular to the semipolar surface 71a, but are different from the conventional cleaved facets like the hitherto used c-planes, m-planes, or a-planes. Part (c) of FIG. 7 shows the laser stripe that is provided to extend (2) in the <11-20> direction, and shows end faces 81c, 81d for the laser cavity along with the semipolar surface 71a. The end faces 81c, 81d are approximately perpendicular to the semipolar surface 71a and are composed of a-planes.

The fractured faces made by break are observed with a scanning electron microscope, and no prominent unevenness is observed in each of (1) and (2). From this result, the flatness (magnitude of unevenness) of the fractured faces can be not more than 20 nm. Furthermore, the perpendicularity of the fractured faces to the surface of the sample can be within a range of not less than −5° and not more than +5°.

The end faces of the laser bar are coated with a dielectric multilayer film by vacuum vapor deposition. The dielectric multilayer film comprises an alternate stack of $SiO_2$ and $TiO_2$. Each thickness thereof is adjusted in a range of 50 to 100 nm and is designed so that the center wavelength of reflectance falls within a range of 500 to 530 nm. The reflecting surface on one side has an alternate stack of ten cycles and a designed value of reflectance of about 95%, and the reflecting surface on the other side has an alternate stack of six cycles and a designed value of reflectance of about 80%.

The devices thus formed are operated by current injection to make their evaluation at room temperature. A pulsed power source is used as a power supply for the operation by current injection, and supplies pulses with the pulse width of 500 ns and the duty ratio of 0.1%, and the operation by current injection is implemented through probing needles that are in contact with the surface electrodes. In light output measurement, an emission from the end face of the laser bar is detected with a photodiode to obtain a current-light output characteristic (I-L characteristic). In measurement of emission wavelength, the emission from the end face of the laser bar is supplied through an optical fiber to a spectrum analyzer of a detector to measure a spectrum thereof. In estimation of a polarization, the emission from the laser bar is made to pass through a polarizing plate by rotation, thereby determining the polarization state. In observation of LED-mode emission, an optical fiber is aligned to the front surface side of the laser bar to measure optical emission from the front surface.

The polarization in the laser beam is measured for every laser device, and it is found that the laser beam is polarized in the a-axis direction. The lasing wavelength is in a range of 500-530 nm.

Figure 9:
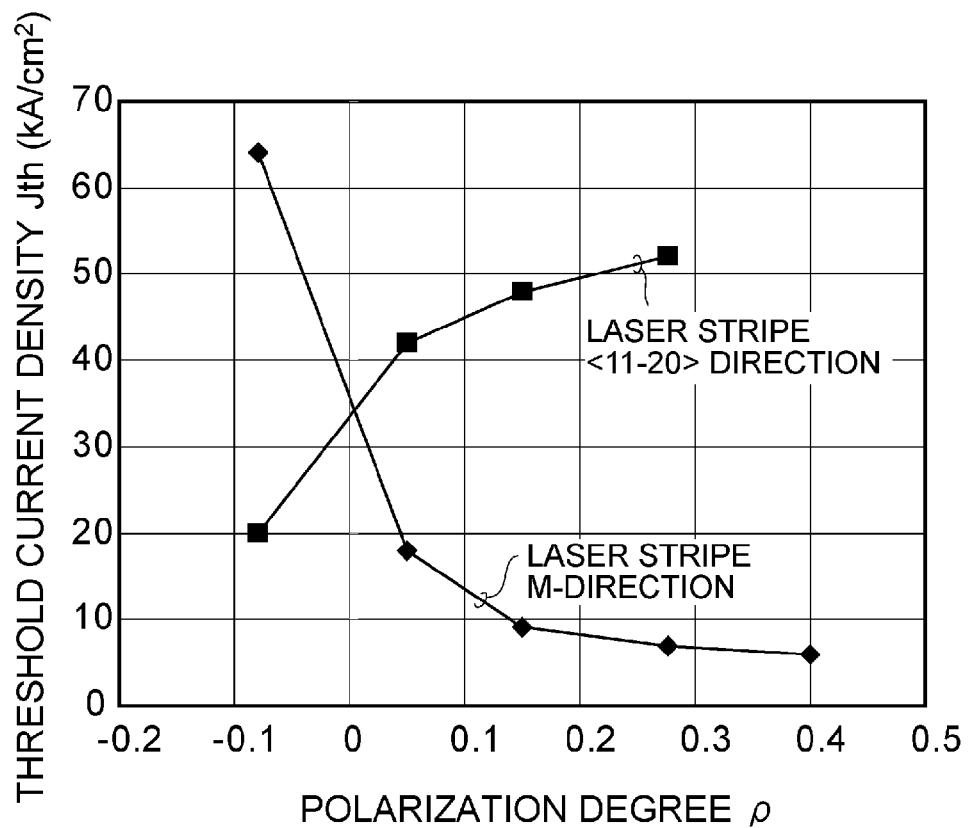
FIG. 9 is a drawing showing a relation of determined polarization degree ρ versus threshold current density.

The polarization state in the LED mode (i.e., spontaneous emission) is measured for every laser device. The current density is 7.4 A/cm². When the polarization component in the a-axis direction is referred to as I1, and the polarization component in the direction of the projected m-axis onto the principal surface is referred to as I2, the polarization degree ρ is defined as (I1−I2)/(I1+I2). The relation between determined polarization degree ρ and minimum of threshold current density is investigated, and the result obtained is shown in FIG. 9. As seen from FIG. 9, the threshold current density demonstrates a significant decrease in the laser (1) with the laser stripe along the M-direction when the polarization degree is positive. Namely, it is seen that when the polarization degree is positive (I1>I2) and the waveguide is provided along an off direction, the threshold current density is significantly decreased. The data shown in FIG. 9 is as follows.

| Polarization degree, | Threshold current, (M-direction stripe), | Threshold current (<11-20> stripe); |
|---|---|---|
| 0.08, | 64, | 20; |
| 0.05, | 18, | 42; |
| 0.15, | 9, | 48; |
| 0.276, | 7, | 52; |
| 0.4, | 6 | |

Figure 21:
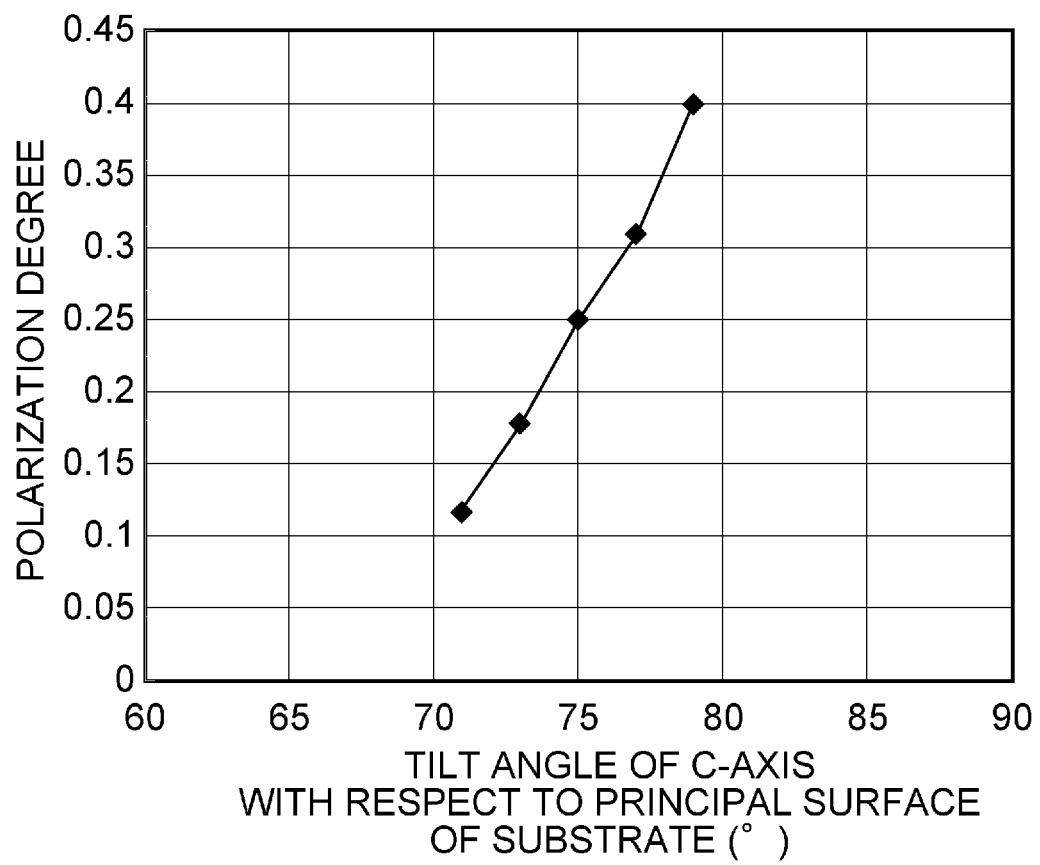
FIG. 21 is a drawing showing a relation between tilt angle of the c-axis with respect to the principal surface of the substrate and polarization degree.

In order to obtain a high polarization degree, the GaN substrate having a principal surface slightly tilting with respect to the {20-21} plane is prepared by adjusting an angle at which the GaN substrate is cut, and a relation between polarization degree and tilt angle of the principal surface of this GaN substrate with respect to the c-axis is investigated, and the result obtained is shown in FIG. 21. When the principal surface of the GaN substrate is the {20-21} plane, the angle between this principal surface and the c-plane is about 75°. However, it can be seen that the polarization degree becomes higher, as this angle becomes larger and nears 90°. That is, in order to obtain a high polarization degree, it is efficient to use a substrate with a principal surface such that an angle between this principal surface of the GaN substrate and the c-plane is as close as possible to 90° and this principal surface slightly tilts with respect to the {20-21} plane. The data shown in FIG. 21 is as follows.

| Substrate angle polarization degree, | polarization degree; |
|---|---|
| 71, | 0.12; |
| 73, | 0.18; |
| 75, | 0.276; |
| 77, | 0.31; |
| 79, | 0.40 |

Figure 22:
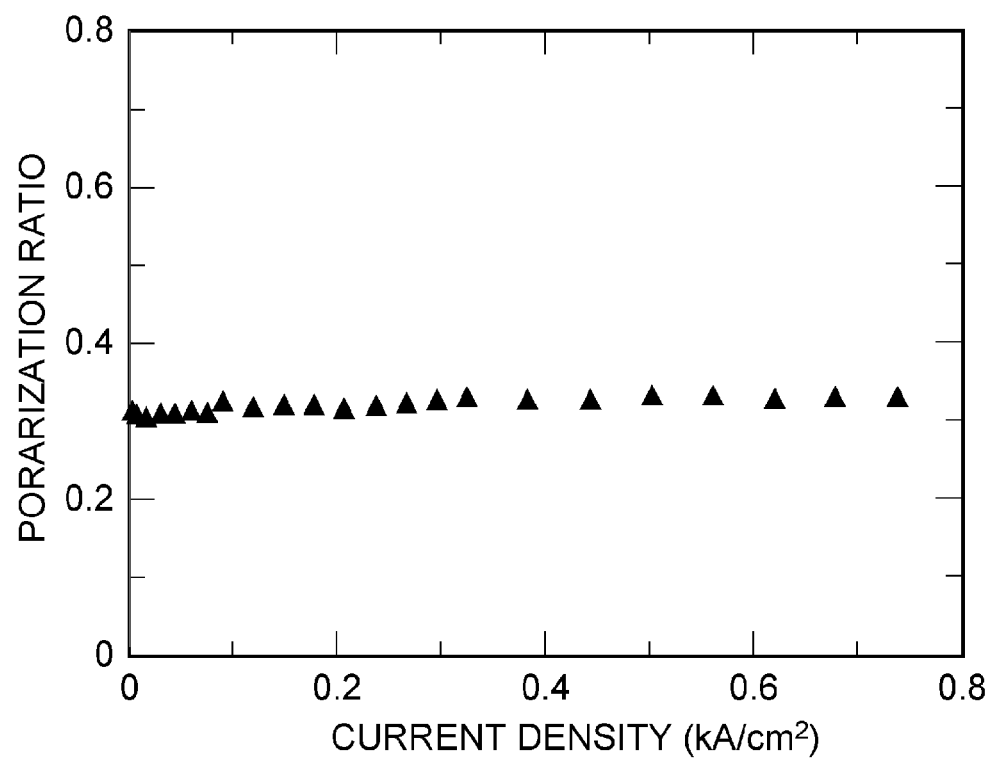
FIG. 22 is a drawing showing a relation between current density and polarization degree.

In addition, in order to confirm the stability of the polarization degree of laser emitted by the group-III nitride semiconductor laser device which includes the GaN substrate having a principal surface of the {20-21} plane, the current density dependence of the polarization degree is investigated by increasing the current density to 0.74 kA/cm², and the result obtained is shown in FIG. 22. Even if the current density is increased, the polarization degree is almost constant and not changed. Therefore, even if the current density is close to the threshold current density of lasing, the polarization degree is not lowered, and it is efficient for lasing of low threshold.

Figure 10:
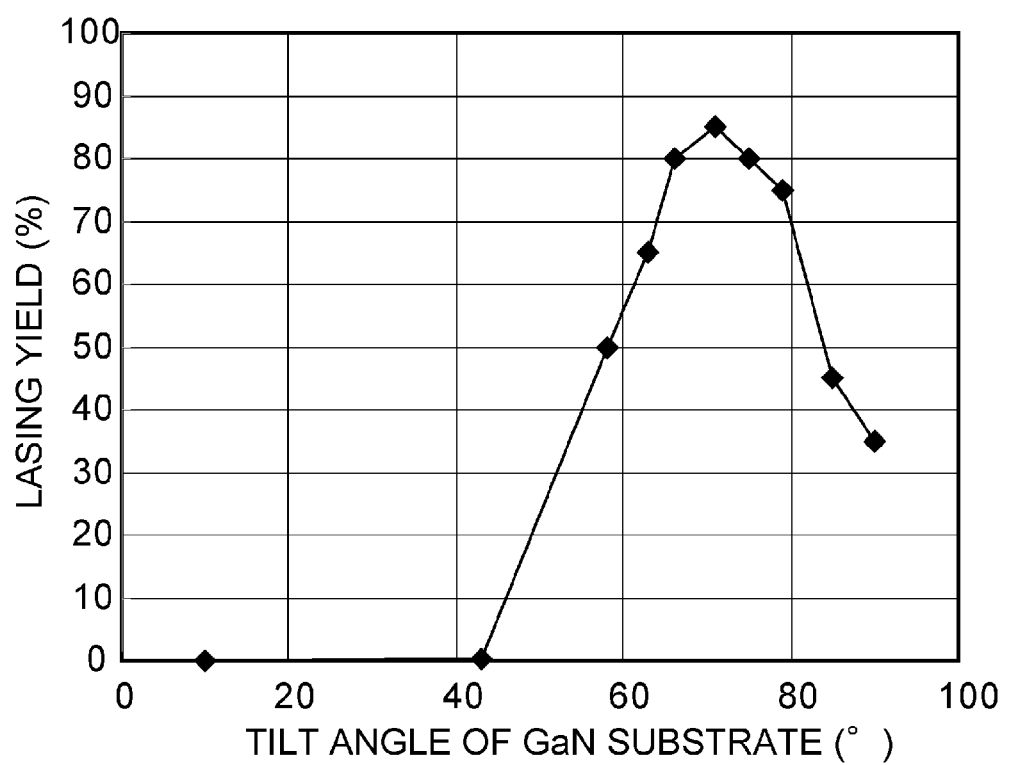
FIG. 10 is a drawing showing a relation of tilt angles of the c-axis toward the m-axis of GaN substrate versus lasing yield.

The relation between the tilt angle (the off angle) of the c-axis of the GaN substrate toward the m-axis, and lasing yield is investigated, and the result thus obtained is shown in FIG. 10. In the present example, the lasing yield is defined as (the number of laser chips)/(the number of measured chips). FIG. 10 is a plot for substrates, having the stacking fault density of substrate of not more than $1 \times 10^4$ (cm$^{-1}$), on which lasers with the laser stripe along (1) the M-direction are formed. As seen from FIG. 10, the lasing yield is extremely low in the off angles of not more than 45°. The observation of the end faces with an optical microscope finds that an m-plane is formed in almost all chips at the tilt angles smaller than 45°, resulting in failure in achieving perpendicularity. The observation also finds that when the off angle is in a range of not less than 63° and not more than 80°, the perpendicularity is improved and the lasing yield increases to 50% or more. From these experimental results, the optimum range of off angle of the GaN substrate is not less than 63° and not more than 80°. The same result is also obtained in a range of not less than 100° and not more than 117°, which is an angular range to provide crystallographically equivalent end faces. The data shown in FIG. 10 is as follows.

| Tilt angle, | Yield; |
|---|---|
| 10, | 0.1; |
| 43, | 0.2; |
| 58, | 50; |
| 63, | 65; |
| 66, | 80; |
| 71, | 85; |
| 75, | 80; |
| 79, | 75; |
| 85, | 45; |
| 90, | 35 |

Figure 18:
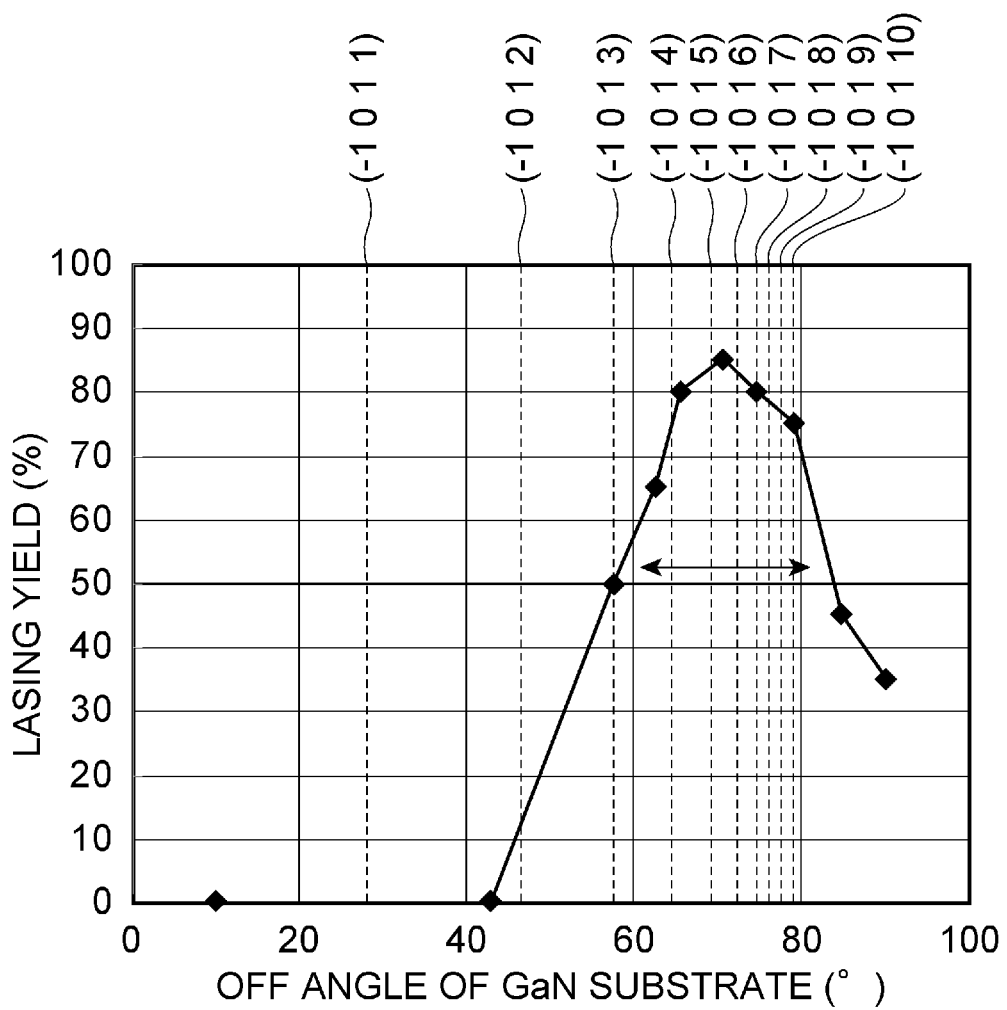
FIG. 18 is a drawing showing a relation between off angle of GaN substrate, lasing yield, and plane index.

A relation between off angle of the GaN substrate and plane index of a surface (corresponding to the regions R1, R2) orthogonal both to a surface including the c-axis and the m-axis of the hexagonal group-III nitride semiconductor of the GaN substrate and to the principal surface of the GaN substrate is shown in FIG. 18. A graph shown in FIG. 18 is identical to a graph shown in FIG. 10. As shown in FIG. 18, when the off angle of the GaN substrate is in a range of not less than 45° and not more than 80°, a plane index of a surface corresponding to the regions R1, R2 is any one of (−1, 0, 1, 2), (−1, 0, 1, 3), (−1, 0, 1, 4), (−1, 0, 1, 5), (−1, 0, 1, 6), (−1, 0, 1, 7), (−1, 0, 1, 8), (−1, 0, 1, 9), (−1, 0, 1, 10). On the contrary, when the off angle of the GaN substrate is in a range of not less than 63° and not more than 80°, a plane index of a surface corresponding to the regions R1, R2 is any one of (−1, 0, 1, 4), (−1, 0, 1, 5), (−1, 0, 1, 6), (−1, 0, 1, 7), (−1, 0, 1, 8), (−1, 0, 1, 9), (−1, 0, 1, 10). As the surface forming the laser cavity mirror includes the regions R1, R2 having such a plane index, this laser cavity mirror has flatness and perpendicularity. According to FIG. 18, the lasing yield of the laser cavity can be improved up to not less than 50%. In addition, the off angle of the GaN substrate shown in FIG. 18 corresponds to the angle between the principal surface and the c-plane shown in FIG. 19, and plane indices shown in FIG. 18 correspond to plane indices shown in FIG. 19.

Figure 20:
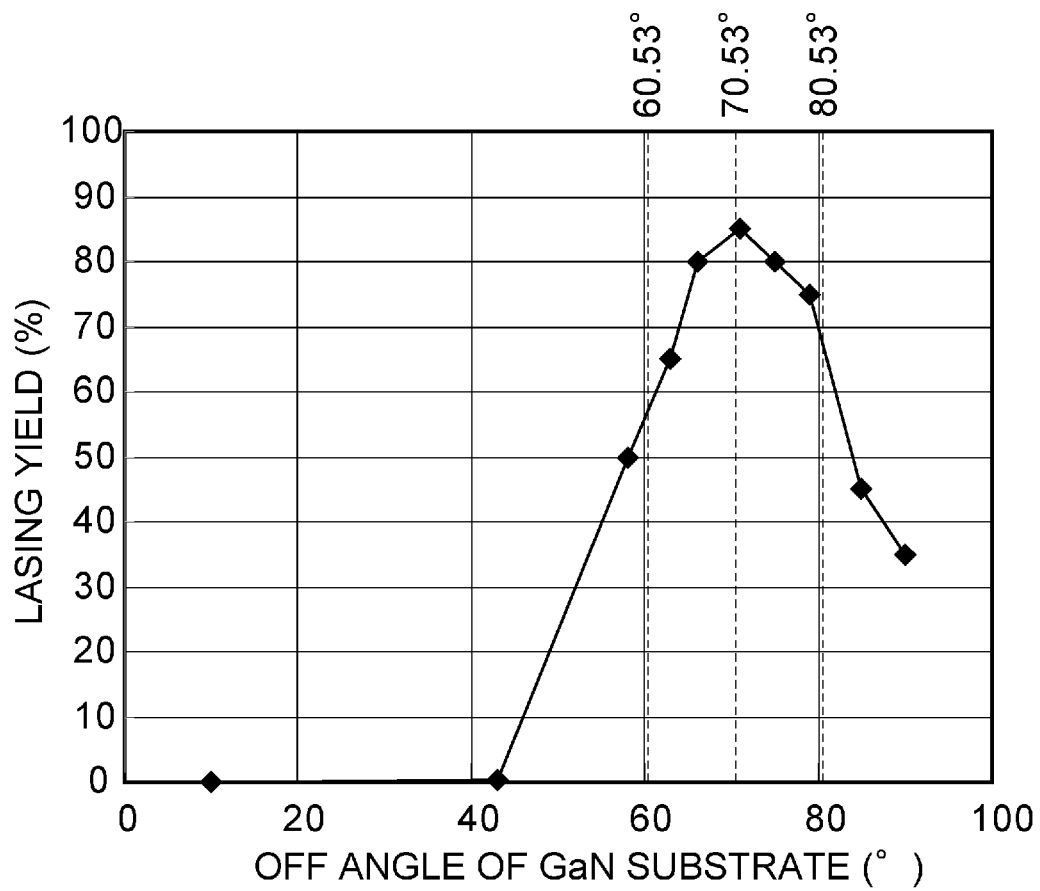
FIG. 20 is a drawing showing a relation between off angle of GaN substrate, lasing yield, and off angle of GaN substrate having a range of 70.53±10°.

In addition, both of the graph shown in FIG. 10 and the notable description of a range of the off angle of the GaN substrate (a range of 70.53±10) are shown in FIG. 20. As shown in FIG. 20, when the off angle of GaN substrate is in a range of 70.53±10, that is, in a range of not less than 60.53° and not more than 80.53, a plane index of a surface corresponding to the regions R1, R2 is any one of (−1, 0, 1, 4), (−1, 0, 1, 5), (−1, 0, 1, 6), (−1, 0, 1, 7), (−1, 0, 1, 8), (−1, 0, 1, 9), (−1, 0, 1, 10). As the surface forming the laser cavity mirror includes the regions R1, R2 having such a plane index, this laser cavity mirror has flatness and perpendicularity. According to FIG. 20, the lasing yield of the laser cavity can be improved up to not less than 50%.

Indicated below is the result of investigation of embodiment of the breaking in the step S106 on the angle between the principal surface of the GaN substrate and the c-plane of the hexagonal group-III nitride semiconductor of the GaN substrate. When the angle between the principal surface of the GaN substrate and the c-plane of the hexagonal group-III nitride semiconductor of the GaN substrate is 0°, the substrate product breaks at the m-plane with good yield by the breaking in the step S106. When the angle between the principal surface of the GaN substrate and the c-plane of the hexagonal group-III nitride semiconductor of the GaN substrate is in a range of more than 0° and less than 45°, the substrate product breaks at the m-plane by the breaking in the step S106. When the angle between the principal surface of the GaN substrate and the c-plane of the hexagonal group-III nitride semiconductor of the GaN substrate is in a range of not less than 45° and less than 63°, some substrate products break at the m-plane by the breaking in the step S106, and others break perpendicularly on the principal surface by the breaking in the step S106. When the angle between the principal surface of the GaN substrate and the c-plane of the hexagonal group-III nitride semiconductor of the GaN substrate is in a range of not less than 63° and not more than 80°, many substrate products break perpendicularly on the principal surface by the breaking in the step S106. The end face (corresponding to such as the end face 63a) formed by this breaking includes high index (−1, 0, 1, L) plane perpendicular to the principal surface, L including an integer number in a range of not less than 4 and not more than 10. When the angle between the principal surface of the GaN substrate and the c-plane of the hexagonal group-III nitride semiconductor of the GaN substrate is in a range of more than 80° and less than 90°, the substrate product does not easily break by the breaking in the step S106, and when the angle between the principal surface of the GaN substrate and the c-plane of the hexagonal group-III nitride semiconductor of the GaN substrate is 90°, the substrate product breaks at the c-plane with good yield by the breaking in the step S106.

Figure 11:
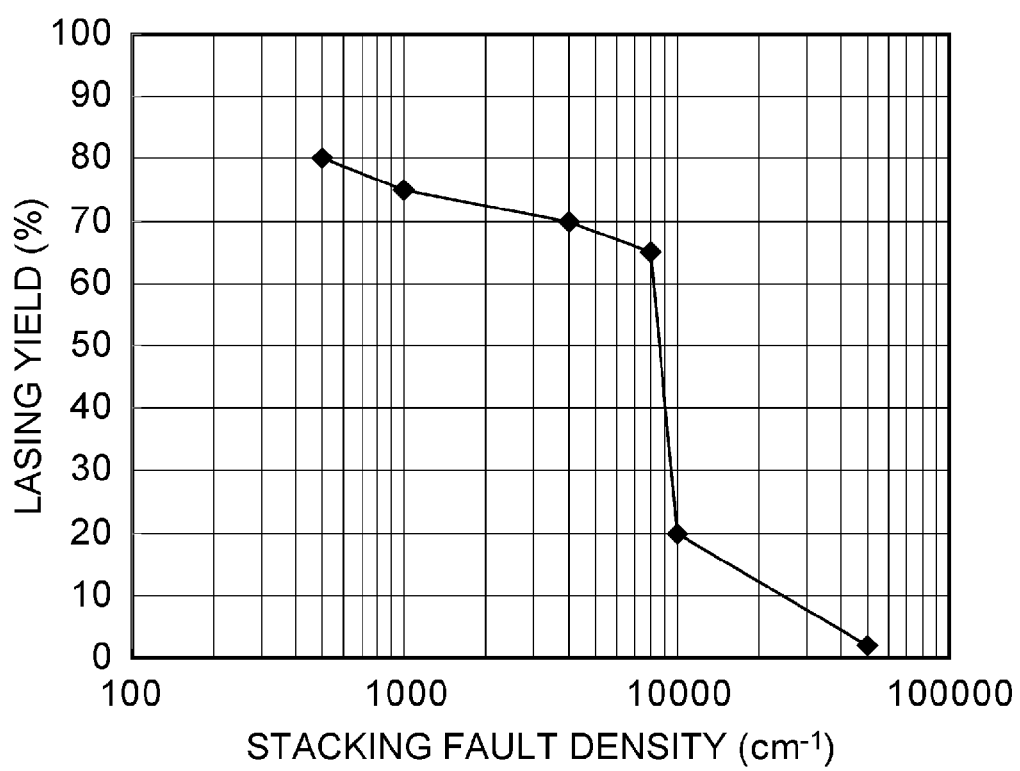
FIG. 11 is a drawing showing a relation of stacking fault density versus lasing yield.

The relation between stacking fault density and lasing yield is investigated and the result obtained is shown in FIG. 11. The definition of lasing yield is the same as above. As seen from FIG. 11, the lasing yield is suddenly decreased with the stacking fault density over $1 \times 10^4$ (cm⁻). The observation of the end face state with an optical microscope shows that devices in the sample group categorized as decreased lasing yield exhibits the significant unevenness of the end faces, so that no flat fractured faces are obtained. The reason therefor is that a difference in easiness of fracture depends on the existence of stacking faults. From this result, the stacking fault density in the substrate is not more than $1 \times 10^4$ (cm⁻¹). The data shown in FIG. 11 is as follows.

| Stacking fault density (cm⁻¹), | Yield; |
|---|---|
| 500, | 80; |
| 1000, | 75; |
| 4000, | 70; |
| 8000, | 65; |
| 10000, | 20; |
| 50000, | 2 |

Figure 12:
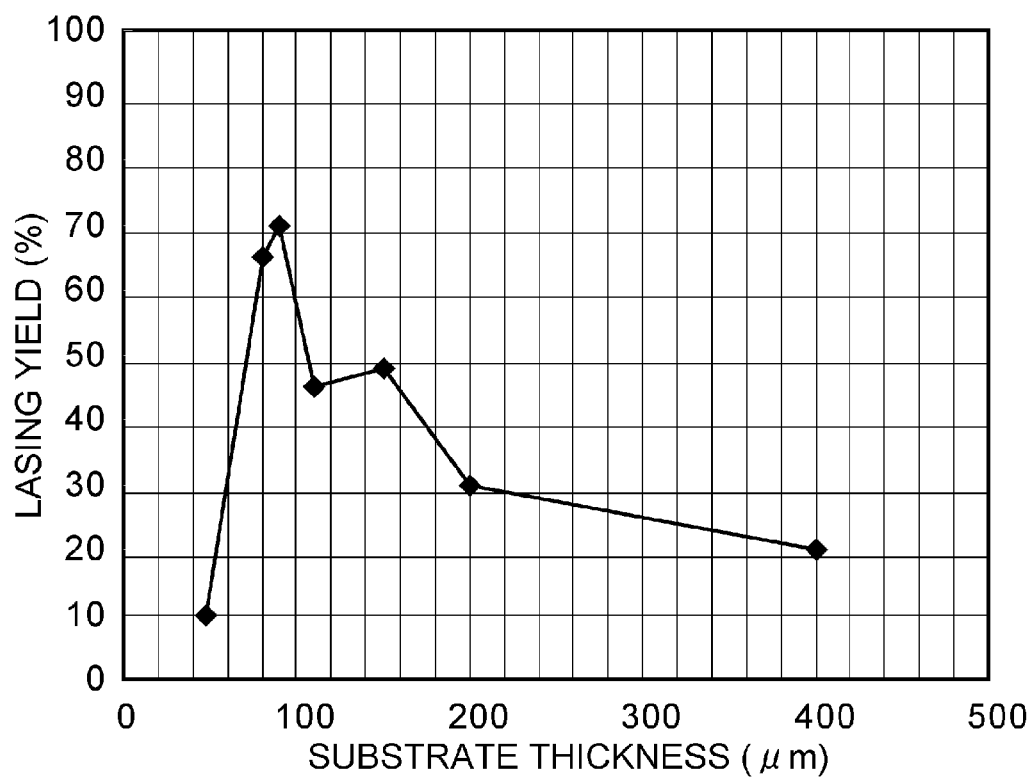
FIG. 12 is a drawing showing a relation of substrate thickness versus lasing yield.

The relation between substrate thickness and lasing yield is investigated, and the result obtained is shown in FIG. 12. The definition of lasing yield is the same as above. FIG. 12 is a plot for laser devices in which the stacking fault density of the substrate is not more than $1 \times 10^4$ (cm⁻¹) and the laser stripe extends along (1) the M-direction. From FIG. 12, the lasing yield is high when the substrate thickness is smaller than 100 μm and larger than 50 μm. When the substrate thickness is larger than 100 μm, the perpendicularity of fractured faces becomes deteriorated. When the thickness is smaller than 50 μm, handling of substrates does not become easy and the semiconductor chips become easy to break. From these, the optimum thickness of the substrate is in a range of not less than 50 μm and not more than 100 μm. The data shown in FIG. 12 is as follows.

| Substrate thickness, | Yield; |
|---|---|
| 48, | 10; |
| 80, | 65; |
| 90, | 70; |
| 110, | 45; |
| 150, | 48; |
| 200, | 30; |
| 400, | 20 |

EXAMPLE 3

Figure 13:
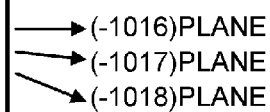
FIG. 13 is a drawing showing angles between (20-21) plane and other plane orientations (indices).

In Example 2, the plurality of epitaxial films for the semiconductor laser are grown on the GaN substrate having the {20-21} surface. As described above, the end faces for the optical cavity are formed through the formation of scribed grooves and by press. In order to find candidates for these end faces, plane orientations different from the a-plane and making an angle near 90° with respect to the (20-21) plane are obtained by calculation. With reference to FIG. 13, the following angles and plane orientations have angles near 90° with respect to the (20-21) plane.

| Specific plane index, | Angle to {20-21} plane; |
|---|---|
| (−1016), | 92.46°; |
| (−1017), | 90.10°; |
| (−1018), | 88.29° |

Figure 14:
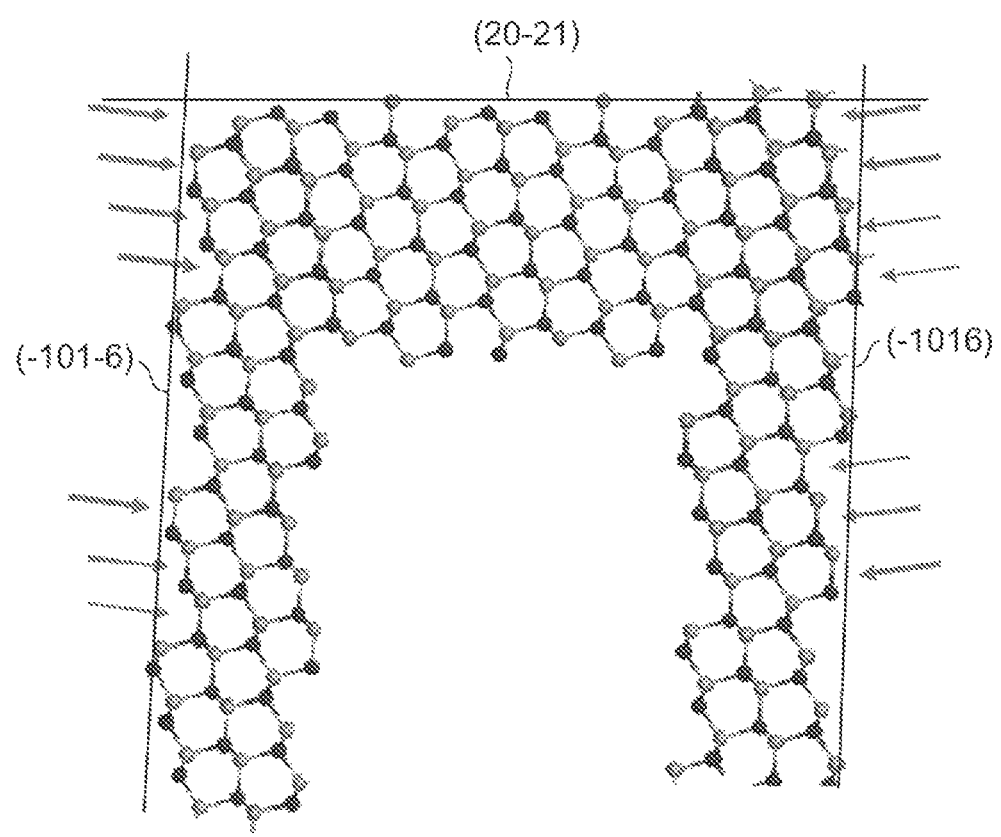
FIG. 14 is a drawing showing atomic arrangements in (20-21) plane, (−101-6) plane, and (−1016) plane.
Figure 15:
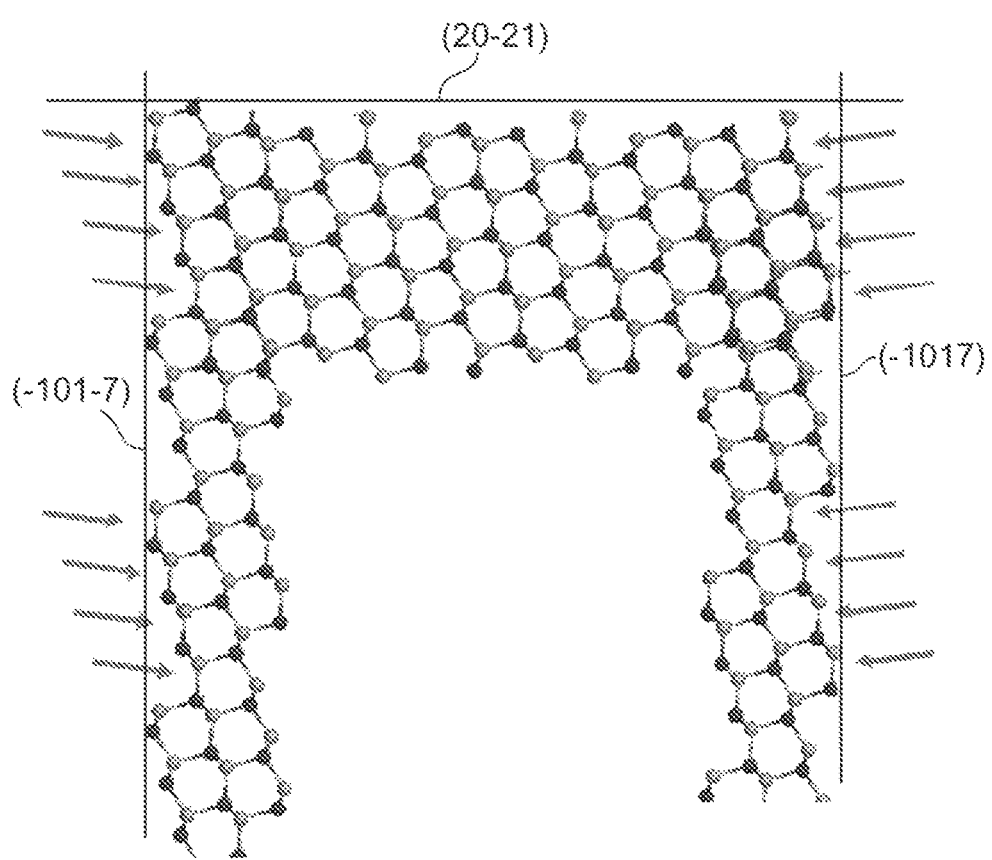
FIG. 15 is a drawing showing atomic arrangements in (20-21) plane, (−101-7) plane, and (−1017) plane.
Figure 16:
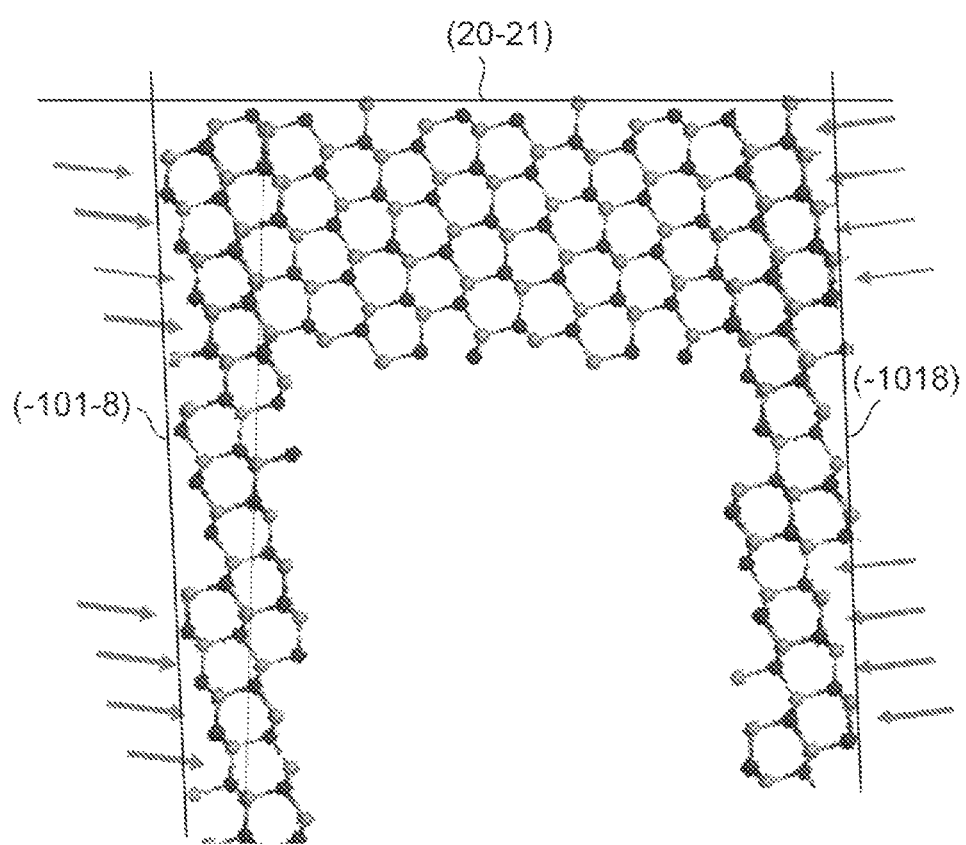
FIG. 16 is a drawing showing atomic arrangements in (20-21) plane, (−101-8) plane, and (−1018) plane.

FIG. 14 is a drawing showing atomic arrangements in the (20-21) plane, (−101-6) plane, and (−1016) plane. FIG. 15 is a drawing showing atomic arrangements in the (20-21) plane, (−101-7) plane, and (−1017) plane. FIG. 16 is a drawing showing atomic arrangements in the (20-21) plane, (−101-8) plane, and (−1018) plane. As shown in FIGS. 14 to 16, local atom arrangements indicated by arrows show configurations of atoms with charge neutrality, and electrically neutral arrangements of atoms appear periodically. The reason why near-vertical faces with respect to the grown surface are obtained can be that creation of fractured faces is considered to be relatively stable because of the periodic appearance of the neutral atomic configurations in terms of charge.

According to various experiments containing the above-described Examples 1 to 3, the angle ALPHA can be in a range of not less than 45° and not more than 80° or in a range of not less than 100° and not more than 135°. In order to improve the laser chip yield, the angle ALPHA can be in a range of not less than 63° and not more than 80° or in a range of not less than 100° and not more than 117°. The typical semipolar principal surface can be any one of {20-21} plane, {10-11} plane, {20-2-1} plane, and {10-1-1} plane. Furthermore, the principal surface can be a slight tilt surface from these semipolar surfaces. For example, the semipolar principal surface can be a slight tilt surface off in a range of not less than −4° and not more than +4° toward the m-plane with respect to any one of {20-21} plane, {10-11} plane, {20-2-1} plane, and {10-1-1} plane.

As described above, the present embodiment provides the group-III nitride semiconductor laser device with the laser cavity enabling the low threshold current, on the semipolar surface of the support base that tilts with respect to the c-axis of the hexagonal group-III nitride toward the m-axis. The present embodiment also provides the method for fabricating the group-III nitride semiconductor laser device.

Having described and illustrated the principle of the invention in a preferred embodiment thereof, it is appreciated by those having skill in the art that the invention can be modified in arrangement and detail without departing from such principles. The present invention is not limited to the specific configurations disclosed in the embodiment. We therefore claim all modifications and variations coming within the spirit and scope of the following claims.

What is claimed is:

1. A method for fabricating a group-III nitride semiconductor laser device, the method comprising the steps of:
    preparing a substrate of a hexagonal group-III nitride semiconductor, the substrate having a semipolar principal surface;
    forming a substrate product that has a laser structure, an anode electrode and a cathode electrode, the laser structure including the substrate and a semiconductor region, the semiconductor region being formed on the semipolar principal surface;
    scribing a first surface of the substrate product in part in a direction of an a-axis of the hexagonal group-III nitride semiconductor; and
    carrying out breakup of the substrate product by press against a second surface of the substrate product, to form another substrate product and a laser bar,
    the first surface being opposite to the second surface,
    the semiconductor region being located between the first surface and the substrate,
    the laser bar having first and second end faces, the first and second end faces being formed by the breakup, and the first and second end faces extending from the first surface to the second surface,
    the first and second end faces constituting a laser cavity of the group-III nitride semiconductor laser device,
    the anode electrode and the cathode electrode being formed on the laser structure,
    the semiconductor region comprising a first cladding layer of a first conductivity type gallium nitride-based semiconductor, a second cladding layer of a second conductivity type gallium nitride-based semiconductor and an active layer, the active layer being provided between the first cladding layer and the second cladding layer,
    the first cladding layer, the second cladding layer, and the active layer being arranged along a normal axis to the semipolar principal surface,
    the active layer comprising a gallium nitride-based semiconductor layer,
    a c-axis of the hexagonal group-III nitride semiconductor of the substrate tilting at an angle ALPHA with respect to the normal axis toward an m-axis of the hexagonal group-III nitride semiconductor,
    the angle ALPHA falling within a range of not less than 45° and not more than 80° or within a range of not less than 100° and not more than 135°,
    the first and second end faces intersecting with an m-n plane defined by the m-axis of the hexagonal group-III nitride semiconductor and the normal axis, and
    the first and second end faces including a region such that an angle between this region and a plane indicated by plane index (−1, 0, 1, L) or (1, 0, −1, −L) falls within a range of not less than −5° and not more than +5°, with L as an integer number not less than 4.

2. The method according to claim 1, wherein the first and second end faces can include a region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than −10° and not more than +10°.

3. The method according to claim 1, wherein a part of the first and second end faces that is included in the active layer can include a part of or the whole of a region such that an angle between this region and the plane indicated by plane index (−1, 0, 1, L) or (1, 0,−1,−L) falls within a range of not less than −5° and not more than +5°.

4. The method according to claim 1, wherein a part of the first and second end faces that is included in the active layer can include a part of or the whole of a region such that an angle formed by this region and the arrangements of N atom-Ga atom extending toward a direction tilting at an angle of 70.53° in the direction opposite to the direction of the m-axis of the hexagonal group-III nitride semiconductor with respect to the direction of the c-axis of the hexagonal group-III nitride semiconductor, falls within a range of not less than −10° and not more than +10°.

5. The method according to claim 1, wherein the angle ALPHA falls within a range of not less than 63° and not more than 80° or within a range of not less than 100° and not more than 117°.

6. The method according to claim 1, wherein the step of forming the substrate product comprises performing processing such as slicing or grinding of the substrate so that a thickness of the substrate becomes not more than 400μm, and
wherein the second surface is one of the following: a processed surface formed by the processing; and a surface including an electrode formed on the processed surface.

7. The method according to claim 1, wherein the step of forming the substrate product comprises polishing the substrate so that a thickness of the substrate becomes not less than 50μm and not more than 100μm, and
wherein the second surface is one of the following: a polished surface formed by the polishing; and a surface including an electrode formed on the polished surface.

8. The method according to claim 1, wherein the scribing is carried out using a laser scriber, and
wherein the scribing forms a scribed groove, and a length of the scribed groove is shorter than a length of an intersecting line between the first surface and an a-n plane defined by the normal axis and the a-axis of the hexagonal group-III nitride semiconductor.

9. The method according to claim 1, wherein the semipolar principal surface is any one of {20-21} plane, {10-11} plane, {20-2-1} plane, and {10-1-1} plane.

10. The method according to claim 1, wherein the substrate comprises any one of GaN, AlGaN, AlN, InGaN, and InAlGaN.

* * * * *